(12) United States Patent
Mori

(10) Patent No.: US 10,849,231 B2
(45) Date of Patent: Nov. 24, 2020

(54) LAMINATE AND CIRCUIT BOARD

(71) Applicant: Toppan Forms Co., Ltd., Tokyo (JP)

(72) Inventor: Akihito Mori, Tokyo (JP)

(73) Assignee: TOPPAN FORMS CO., LTD., Tokyo (JP)

( * ) Notice: Subject to any disclaimer, the term of this patent is extended or adjusted under 35 U.S.C. 154(b) by 563 days.

(21) Appl. No.: 14/778,162

(22) PCT Filed: Mar. 27, 2014

(86) PCT No.: PCT/JP2014/059028
§ 371 (c)(1),
(2) Date: Sep. 18, 2015

(87) PCT Pub. No.: WO2014/157581
PCT Pub. Date: Oct. 2, 2014

(65) Prior Publication Data
US 2016/0286653 A1    Sep. 29, 2016

(30) Foreign Application Priority Data

Mar. 29, 2013  (JP) ................................. 2013-072363
Mar. 20, 2014  (JP) ................................. 2014-059150

(51) Int. Cl.
*H05K 1/18*        (2006.01)
*H05K 3/32*        (2006.01)
(Continued)

(52) U.S. Cl.
CPC .............. *H05K 1/181* (2013.01); *B32B 15/00* (2013.01); *C09D 11/52* (2013.01); *C09J 169/00* (2013.01);
(Continued)

(58) Field of Classification Search
CPC ....... H05K 2203/125; H05K 1/09–097; H05K 3/321; H05K 1/00–189;
(Continued)

(56) References Cited

U.S. PATENT DOCUMENTS 4,822,829 A * 4/1989 Muller .................... C08G 18/42
                                                                522/104
6,164,520 A * 12/2000 Lahoti .................. B23K 1/0016
                                                                228/123.1
(Continued)

FOREIGN PATENT DOCUMENTS

CN       1287771     3/2001
CN      101390210    3/2009
(Continued)

OTHER PUBLICATIONS

DeCarlo, L. T. On the meaning and use of kurtosis. Psychological Methods, 1997, vol. 2, pp. 292-307 (Year: 1997).*
(Continued)

*Primary Examiner* — Stephen E Rieth
(74) *Attorney, Agent, or Firm* — Hoffmann & Baron, LLP

(57) ABSTRACT

Provided are a laminate including a silver layer on a substrate, in which the silver layer includes a surface in which Kurtosis of a roughness curve satisfies at least one of Condition (i) the change rate of Kurtosis is greater than or equal to 50% under conditions of a temperature of 85° C. and a relative humidity of 85% after 240 hours have elapsed and Condition (ii) the change rate of Kurtosis is greater than or equal to 200% under conditions of a temperature of 85° C. and a relative humidity of 85% after 480 hours have elapsed, and a circuit board in which an electronic component is mounted on the surface of the laminate through a conductive joint portion.

11 Claims, 3 Drawing Sheets

(51) Int. Cl.
| | |
|---|---|
| *B32B 15/00* | (2006.01) |
| *H05K 3/10* | (2006.01) |
| *H05K 1/09* | (2006.01) |
| *H05K 3/12* | (2006.01) |
| *H01L 23/498* | (2006.01) |
| *C09D 11/52* | (2014.01) |
| *C09J 169/00* | (2006.01) |

(52) U.S. Cl.
CPC ......... *H01L 23/49883* (2013.01); *H05K 1/09* (2013.01); *H05K 1/092* (2013.01); *H05K 3/105* (2013.01); *H05K 3/321* (2013.01); *B32B 2457/08* (2013.01); *H01L 2924/0002* (2013.01); *H05K 1/097* (2013.01); *H05K 3/1208* (2013.01); *H05K 2201/06* (2013.01); *H05K 2201/10636* (2013.01); *H05K 2203/1157* (2013.01); *H05K 2203/121* (2013.01); *Y02P 70/611* (2015.11)

(58) Field of Classification Search
CPC .... C09J 175/14–16; C09D 11/52; H01R 4/04; H01K 1/00–189
See application file for complete search history.

(56) References Cited

U.S. PATENT DOCUMENTS

| | | | |
|---|---|---|---|
| 6,194,492 B1* | 2/2001 | Sakurai | H05K 3/323 252/511 |
| 2006/0130700 A1* | 6/2006 | Reinartz | B41M 5/0023 106/31.92 |
| 2008/0047130 A1* | 2/2008 | Lin | H05K 3/041 29/600 |
| 2010/0286301 A1* | 11/2010 | Sakata | C08F 283/006 522/96 |
| 2012/0262931 A1* | 10/2012 | Namiki | C09J 9/02 362/382 |
| 2012/0281411 A1* | 11/2012 | Kajiya | H05K 1/028 362/249.02 |
| 2013/0121872 A1* | 5/2013 | Matsumoto | C09D 11/037 420/501 |
| 2015/0068907 A1* | 3/2015 | Fujikawa | C23C 18/1879 205/50 |
| 2015/0203699 A1* | 7/2015 | Aoki | H01B 1/22 420/501 |

FOREIGN PATENT DOCUMENTS

| | | | |
|---|---|---|---|
| JP | 2000022294 A | | 1/2000 |
| JP | A2002076565 | | 3/2002 |
| JP | 2001185828 | | 7/2002 |
| JP | 2005203722 A | | 7/2005 |
| JP | 200666838 A | | 3/2006 |
| JP | 2008063560 A | * | 3/2008 |
| JP | 2010225572 | | 10/2010 |
| WO | WO-2012014933 A1 | * | 2/2012 ........... C09D 11/037 |

OTHER PUBLICATIONS

Machine Translation of JP2008-063560A. Mar. 21, 2008. (Year: 2008).*
Japanese Office Action in corresponding Japanese Patent Application No. 2016-106808 dated Apr. 4, 2017.
Chinese Office Action in corresponding Chinese Patent Application No. 201480018612.1 dated Jun. 3, 2016.
International Search Report for corresponding PCT Application PCT/JP2014/059028, pp. 1-3 (dated Jul. 1, 2014).

* cited by examiner

LAMINATE AND CIRCUIT BOARD

TECHNICAL FIELD

The present invention relates to a laminate including a silver layer, and a circuit board in which an electronic component is mounted on the laminate.

Priority is claimed on Japanese Patent Application No. 2013-072363, filed on Mar. 29, 2013 and Japanese Patent Application No. 2014-059150, filed on Mar. 20, 2014, and the contents of which are incorporated herein by reference.

BACKGROUND ART

A circuit board in which an electronic component such as an external connection electrode is joined onto a wiring portion of a substrate through a conductive adhesive agent or the like is mounted on a wide range of products, and enormous amounts of circuit boards are used.

In such a circuit board, in general, a joining force between the wiring portion and the electronic component easily decreases under high temperature and high humidity conditions.

In response, as a method of improving the joining force between the wiring portion and the electronic component, a method is disclosed in which a surface of a joint portion of the electronic component is covered with a metal such as silver, or surface roughness of the surface of the joint portion is greater than or equal to 0.1 μm and less than 10 μm (refer to PTL 1).

However, even in the method disclosed in PTL 1, the joining force between the wiring portion and the electronic component is not sufficiently obtained under high temperature and high humidity conditions. Among them, in the circuit board in which the wiring portion is configured of silver, how the joining force between the silver wiring and the electronic component is affected by a surface state of the silver wiring (a silver layer) is not sufficiently considered, and thus there is a demand for the development of a new laminate including a silver layer on a support body, which is preferably applied to a circuit board.

CITATION LIST

Patent Literature

[PTL 1] Japanese Unexamined Patent Application, First Publication No. 2002-076565

SUMMARY OF INVENTION

Technical Problem

An object of the present invention is to provide a laminate including a silver layer in which a high joining force with respect to an electronic component is able to be maintained even under high temperature and high humidity conditions, and a circuit board in which the electronic component is mounted on the laminate.

Solution to Problem

The present invention provides a laminate including a silver layer on a substrate, in which the silver layer includes a surface in which Kurtosis of a roughness curve satisfies at least one of Conditions (i) and (ii) described below.

(i) The change rate of Kurtosis is greater than or equal to 50% under conditions of a temperature of 85° C. and a relative humidity of 85% after 240 hours have elapsed.

(ii) The change rate of Kurtosis is greater than or equal to 200% under conditions of a temperature of 85° C. and a relative humidity of 85% after 480 hours have elapsed.

In the laminate of the present invention, the thickness of the substrate may be 10 μm to 10000 μm, and the thickness of the silver layer may be 0.01 μm to 5 μm.

In the laminate of the present invention, a ratio of metal silver of the silver layer may be 99 to 99.9 mass %.

In the laminate of the present invention, the silver layer may be directly formed on the substrate.

The laminate of the present invention may further include an adhesion layer which is formed between the substrate and the silver layer by polymerizing an urethane acrylate resin and has a thickness of 0.5 μm to 10 μm.

In the laminate of the present invention, the Kurtosis of the roughness curve may be a value obtained by Expression (I) described below.

[Expression 1]

$$Rku = \frac{1}{Rq^4}\left[\frac{1}{l}\int_0^l Z^4(x)\,dx\right] \quad (I)$$

(in the expression, Rq represents a root-mean-square height, l represents a reference length which becomes non-dimensional by the fourth power of the root-mean-square height Rq, and Z(x) represents the roughness curve)

In the laminate of the present invention, the Kurtosis of the roughness curve may be obtained by measuring the surface shape of the silver layer of the laminate from an upper portion with respect to the surface by using a shape measurement laser microscope.

In the laminate of the present invention, the Kurtosis of the roughness curve may be obtained by measuring the shape of a sectional surface which is exposed by cutting or machining the silver layer of the laminate from the upper portion with respect to the sectional surface by using a shape measurement laser microscope.

In the laminate of the present invention, the silver layer may be formed of a silver ink composition, the silver ink composition may be blended with silver carboxylate and a nitrogen-containing compound, and in the silver ink composition, a blended amount of the nitrogen-containing compound may be 0.2 mol to 15 mol per 1 mol of a blended amount of the silver carboxylate.

In addition, the present invention provides a circuit board, in which in an electronic component is mounted on a surface of the silver layer of the laminate in which Kurtosis of a roughness curve satisfies at least one of Conditions (i) and (ii) described above through a conductive joint portion.

In the circuit board of the present invention, the conductive joint portion may be a joining layer formed by curing a conductive adhesive agent, or a solder layer.

Advantageous Effects of Invention

The laminate of the present invention includes the silver layer which is able to maintain a high joining force with respect to the electronic component under high temperature and high humidity conditions, and thus the circuit board is able to be obtained by mounting the electronic component on the laminate.

DESCRIPTION OF EMBODIMENTS

Hereinafter, a preferred example of a laminate and a circuit board of the present invention will be described. However, the present invention is not limited only to this example, and for example, addition, omission, substitution, change, and the like (an amount, a number, a position, a size, and the like) are available within a range which does not deviate from the gist of the present invention.

«Laminate»

The laminate according to the present invention includes a silver layer on a substrate, and the silver layer includes a surface in which the Kurtosis of a roughness curve satisfies at least one of Conditions (i) and (ii) described below.

(i) The change rate of Kurtosis is greater than or equal to 50% under conditions of a temperature of 85° C. and a relative humidity of 85% after 240 hours have elapsed.

(ii) The change rate of Kurtosis is greater than or equal to 200% under conditions of a temperature of 85° C. and a relative humidity of 85% after 480 hours have elapsed.

In the laminate, the silver layer includes a surface in which the change rate of the Kurtosis of the roughness curve is in a predetermined range under high temperature and high humidity conditions after a predetermined time has elapsed, and thus on the surface, a high joining force between the silver layer and the electronic component through a conductive joint portion is maintained for a long period of time even under high temperature and high humidity conditions. Here, the "joining force" indicates a force of integrally joining the silver layer to the electronic component, and for example, when the silver layer is adhered to the electronic component by using a conductive adhesive agent, the joining force corresponds to a force (an adhesion force) of adhering the silver layer to the electronic component by an adhesive layer which is formed by curing the conductive adhesive agent.

Herein, the silver layer surface in which the Kurtosis of the roughness curve satisfies at least one of Conditions (i) and (ii) described above is a surface forming a conductive joint portion of the silver layer with respect to the electronic component.

Figure 1:
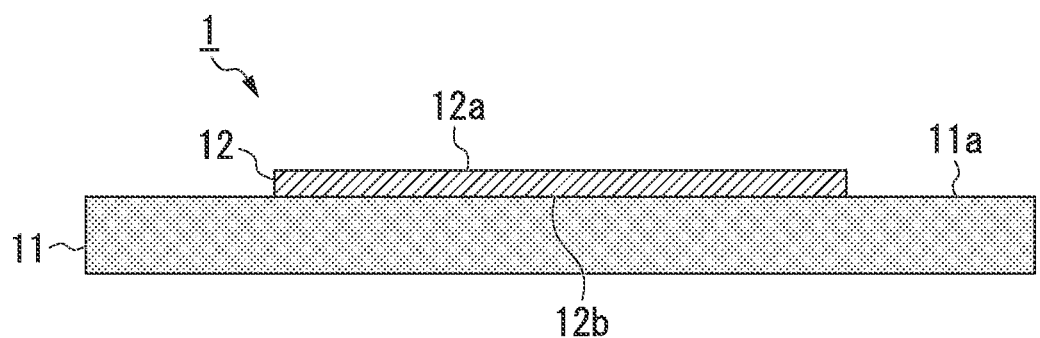
FIG. 1 is a schematic sectional view showing an example of a laminate according to the present invention.

FIG. 1 is a schematic sectional view showing an example of the laminate according to the present invention.

A laminate 1 shown herein includes a silver layer 12 on a substrate 11, and the silver layer 12 is patterned into a predetermined shape on the substrate 11. A surface (one principal surface) 12a of the silver layer 12 is a surface on which an electronic component is mounted through a conductive joint portion in a circuit board described below. In addition, a rear surface (the other principal surface) 12b of the silver layer 12 is a contact surface with respect to a surface 11a of the substrate 11.

Furthermore, in the laminate 1, for example, the silver layer 12 may be laminated on the entire surface 11a of the substrate 11.

The laminate according to the present invention is not limited to what is shown in FIG. 1, and a part of the configuration may be suitably changed within a range which does not impair the effect of the present invention. For example, other layers may be disposed on the substrate 11 other than the silver layer 12, and as the other layer, an adhesion layer which is disposed between the substrate 11 and the silver layer 12 is exemplary examples in order to improve adhesiveness between the substrate 11 and the silver layer 12.

Figure 2:
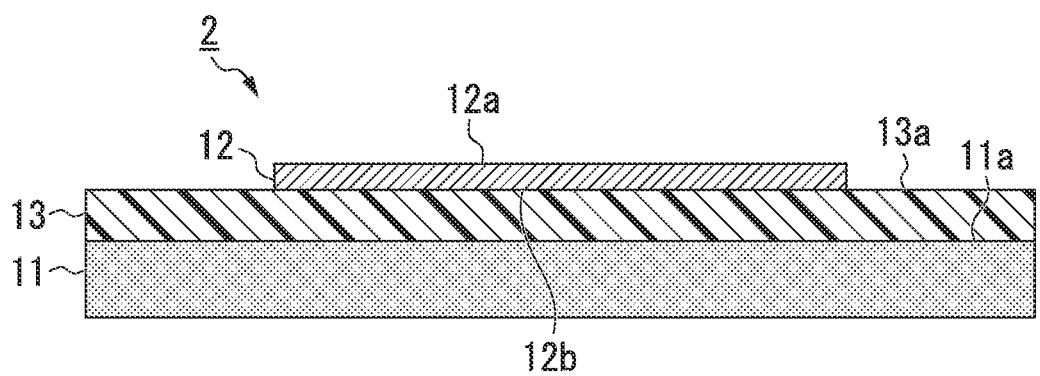
FIG. 2 is a schematic sectional view showing an example of the laminate according to the present invention in which an adhesion layer is disposed.

FIG. 2 is a schematic sectional view showing an example of the laminate according to the present invention in which the adhesion layer is disposed. Furthermore, among constituents shown in FIG. 2, the same reference numerals as those in FIG. 1 are applied to the same constituents as those shown in FIG. 1, and the detailed description thereof will be omitted. The same applies to the following drawings.

In a laminate 2 shown herein, an adhesion layer 13 is disposed between the substrate 11 and the silver layer 12, and except for this point, the laminate 2 is identical to the laminate 1 described above.

The adhesion layer 13 is laminated on the entire surface 11a of the substrate 11, and the silver layer 12 is laminated on a part of a surface 13a of the adhesion layer 13. Furthermore, here, it is shown that the adhesion layer 13 is laminated on the entire surface 11a of the substrate 11, and in the laminate 2, it is preferable that an entire rear surface 12b of the silver layer 12 be in contact with the surface 13a of the adhesion layer 13. In addition, for example, the adhesion layer 13 may be laminated not on the entire surface 11a but on a part of the surface 11a of the substrate 11, and in this case, the adhesion layer 13 may be patterned.

<Substrate>

As the shape of the substrate 11, an arbitrary shape is able to selected depending on the purpose, and it is preferable that the substrate 11 be in the shape of a plate, a film, or a sheet, and the thickness of the substrate 11 is preferably 10 μm to 10000 μm, and is more preferably 50 μm to 5000 μm.

The material of the substrate 11 is not particularly limited and may be selected depending on the purpose, and a material having heat resistance which is not deteriorated at the time of forming the silver layer by performing a heat treatment with respect to a silver ink composition described below is preferable.

As the material of the substrate 11, specifically, a synthetic resin such as polyethylene (PE), polypropylene (PP), polycycloolefin, polyvinyl chloride (PVC), ethylene-vinyl acetate copolymer, polyvinyl alcohol, vinylon, polyvinylidene chloride (PVDC), polymethyl pentene (PMP), polystyrene (PS), polyvinyl acetate (PVAc), polymethyl methacrylate (PMMA), polyethyl methacrylate (PEMA), polybutyl methacrylate (PBMA), polymethyl acrylate (PMA), polyethyl acrylate (PEA), polybutyl acrylate (PBA), an AS resin, an ABS resin, polyamide (PA), polyimide (PI), polyamide imide (PAI), polyacetal, polyethylene terephthalate (PET), glycol-modified polyethylene terephthalate (PET-G), polybutylene terephthalate (PBT), polytrimethylene terephthalate (PTT), polyethylene naphthalate (PEN), polybutylene naphthalate (PBN), polyphenylene sulfide (PPS), polysulfone (PSF), polyether sulfone (PES), polyether ketone (PEK), polyether ether ketone (PEEK), polycarbonate (PC), polyurethane, polyphenylene ether (PPE), modified polyphenylene ether (m-PPE), polyarylate, an epoxy resin, a melamine resin, a phenol resin, and an urea resin are exemplary examples.

In addition, as the material of the substrate 11, in addition to those described above, ceramics such as glass, and silicon; paper such as high quality paper, tissue paper, glassine paper, and parchment paper are exemplary examples.

In addition, the substrate 11 may use together two or more materials such as a glass epoxy resin, and a polymer alloy.

The substrate 11 may be formed of a single layer, or may be formed of a plurality of layers of two or more layers. When the substrate 11 is formed of the plurality of layers, the plurality of layers may be identical to each other or may be different from each other. That is, all of the layers may be identical to each other, all of the layers may be different from each other, or only a part of the layers may be different. Then, when the plurality of layers are different from each other, a combination of the plurality of layers is not particularly limited. Here, the plurality of layers being different from each other indicates that the materials and/or the thicknesses of the respective layers are different from each other.

Furthermore, when the substrate 11 is formed of the plurality of layers, the total thickness of the respective layers may be the preferred thickness of the substrate 11 described above.

<Silver Layer>

The silver layer 12 may be configured such that the Kurtosis of the roughness curve satisfies at least one of Conditions (i) and (ii) described above in a portion of an exposed surface (in FIG. 1 and FIG. 2, a predetermined portion of the surface 12a) on which the electronic component is mounted through at least the conductive joint portion. Furthermore, in FIG. 1 and FIG. 2, as the silver layer 12, a silver layer having a plate-like shape in which there is a side surface connecting the surface 12a and the rear surface 12b is exemplified, and a silver layer having a shape in which the surface 12a is formed from the surface 11a of the substrate 11 or the surface 13a of the adhesion layer 13 through a curved surface or the like without including such a side surface may be used.

The silver layer 12 is formed of metal silver or contains metal silver as a main component. Here, "containing the metal silver as the main component" indicates that a ratio of the metal silver is sufficiently high to the extent of being observed on the appearance when the silver layer is formed of only the metal silver, and for example, the ratio of the metal silver is preferably greater than or equal to 95 mass %, is more preferably greater than or equal to 97 mass %, and is particularly preferably greater than or equal to 99 mass %. The upper limit value of the ratio of the metal silver of the silver layer 12 is, for example, able to be selected from any one of 100 mass %, 99.9 mass %, 99.8 mass %, 99.7 mass %, 99.6 mass %, 99.5 mass %, 99.4 mass %, 99.3 mass %, 99.2 mass %, and 99.1 mass %.

It is preferable that the silver layer 12 be formed by using a forming material of the metal silver described below. It is possible to easily form the silver layer 12 in which the Kurtosis of the roughness curve of the surface 12a satisfies at least one of Conditions (i) and (ii) described above by using not only a method of plating or the like but also the forming material of the metal silver.

The Kurtosis (Rku) of the roughness curve indicates the average of the fourth power of the roughness curve Z(x) in the reference length 1 which becomes non-dimensional by the fourth power of the root-mean-square height Rq. The Kurtosis (Rku) of the roughness curve is specifically obtained by Expression (I) described below. The Kurtosis (Rku) indicates peakedness which is a criterion of acuteness of a surface, and indicates sharpness (acuteness) of a height distribution. That is, the Kurtosis (peakedness) is a parameter regulating the shape of a convex portion in a concave and convex shape, and indicates that the shape of the convex portion in the concave and convex shape is an acute shape such as a needle as the value becomes higher. Here, the roughness curve Z(x) is identical to a roughness curve y=Z(x) in "surface roughness" based on JIS B0601:2001 (ISO4287:1997), that is, in arithmetic average roughness (Ra).

[Expression 2]

$$Rku = \frac{1}{Rq^4}\left[\frac{1}{l}\int_0^l Z^4(x)\,dx\right] \quad (I)$$

The silver layer satisfying Condition (i) described above indicates that the roughness curve of the surface satisfies a relationship of Expression (i)-1 described below at the time of performing a test with respect to the silver layer under conditions of a temperature of 85° C. and a relative humidity of 85% after 240 hours have elapsed.

$$(Rku_{240}-Rku_0)/Rku_0\times 100\geq 50 \quad \text{(i)-1}$$

(in the expression, $Rku_0$ is the Kurtosis of the roughness curve before performing the test; and $Rku_{240}$ is the Kurtosis of the roughness curve after performing the test (after 240 hours have elapsed))

Similarly, the silver layer satisfying Condition (ii) described above indicates that the roughness curve of the surface satisfies a relationship of Expression (ii)-1 described below at the time of performing a test with respect to the silver layer under conditions of a temperature of 85° C. and a relative humidity of 85% after 480 hours have elapsed.

$$(Rku_{480}-Rku_0)/Rku_0\times 100\geq 200 \quad \text{(ii)-1}$$

(in the expression, $Rku_0$ is the Kurtosis of the roughness curve before performing the test; and $Rku_{480}$ is the Kurtosis of the roughness curve after performing the test (after 480 hours have elapsed))

In the present invention, satisfying at least one of Conditions (i) and (ii) described above indicates that the Kurtosis of the roughness curve of the surface is changed to be greater than a predetermined value at the time of placing the silver layer for 240 hours or 480 hours under high temperature and high humidity conditions of a temperature of 85° C. and a relative humidity of 85%. That is, this indicates that the surface state of the silver layer is considerably changed. In order to maintain a high joining force with respect to the electronic component even under high temperature and high humidity conditions, for example, setting the surface roughness of the silver layer 12 to be in a predetermined range or setting the change rate of the surface roughness of the silver layer 12 to be in a predetermined range is not sufficient, and it is necessary to satisfy at least one of Conditions (i) and (ii) described above. Here, the "surface roughness" based on JIS B0601:2001 (ISO4287:1997), indicates the arithmetic average roughness (Ra), and shows a value obtained by Expression (II) described below in the unit of nanometer (nm) when only the reference length 1 is extracted in a direction of an average line from the roughness curve, an X axis is set in the direction of the average line of an extracted portion, a Y axis is set in a direction of longitudinal magnification, and the roughness curve is denoted by y=Z(x).

[Expression 3]

$$Ra = \frac{1}{\ell} \int_0^\ell |Z(x)| dx \quad \text{(II)}$$

The Kurtosis of the roughness curve of the surface of the silver layer 12 may satisfy at least one of Conditions (i) and (ii) described above, and it is preferable that the Kurtosis satisfies both of Conditions (i) and (ii) described above.

The Kurtosis of the roughness curve of the surface of the silver layer 12 is preferably greater than or equal to 1.8, is more preferably greater than or equal to 2, and is preferably less than or equal to 6 in an initial stage (that is, an elapsed time is 0 hours) before the silver layer 12 is retained in predetermined conditions.

The Kurtosis of the roughness curve of the surface of the silver layer 12 is preferably greater than or equal to 3.8, is more preferably greater than or equal to 4.2, and is preferably less than or equal to 45, in a state in which the silver layer 12 is retained under conditions of a temperature of 85° C. and a relative humidity of 85% after 240 hours have elapsed.

The Kurtosis of the roughness curve of the surface of the silver layer 12 is preferably greater than or equal to 5, is more preferably greater than or equal to 6, and is preferably less than or equal to 430, in a state in which the silver layer 12 is retained under conditions of a temperature of 85° C. and a relative humidity of 85% after 480 hours have elapsed.

The Kurtosis of the roughness curve of the surface of the silver layer 12 is able to be obtained by measuring the surface shape of the silver layer 12 from an upper portion of the surface. At this time, a surface of a measurement target may be the surface 12a of the silver layer 12 described above (a surface on which the electronic component is mounted through the conductive joint portion in the circuit board described below), or may be a sectional surface which is newly exposed by cutting or machining the silver layer 12. When the silver layer 12 is cut, the sectional surface is exposed between two different surfaces (for example, between the surface 12a and the rear surface 12b of the silver layer 12). When the silver layer 12 is machined, the sectional surface is exposed in a region of a part in a depth direction from the surface (for example, a region of a part in a thickness direction of the silver layer 12 from the surface 12a of the silver layer 12). The direction of cutting or machining the silver layer 12 is not particularly limited. The sectional surface of the silver layer 12, for example, as shown in FIG. 1, may be any one of a sectional surface in a direction perpendicular to the surface 12a of the silver layer 12 or the surface 11a of the substrate 11, a sectional surface in a direction parallel with the surface 12a of the silver layer 12 or the surface 11a of the substrate 11, and the sectional surface of the silver layer 12 in a direction that forms an angle other than 0° and 90° with respect to the surface 12a of the silver layer 12 or the surface 11a of the substrate 11. Then, the outer shape of the sectional surface is not particularly limited, and for example, as shown in FIG. 1, may be a quadrangular shape, or may be a triangular shape shown at the time of cutting a corner portion of a rectangular parallelepiped. The surface measuring the shape of the silver layer 12 may be the surface of the silver layer 12 to be exposed when the laminate 1 or 2 is retained under conditions of a temperature of 85° C. and a relative humidity of 85%.

The surface shape of the silver layer 12, for example, is able to be measured by using a known method such as a method using a microscope such as a shape measurement laser microscope.

The sectional surface of the silver layer 12 in the direction perpendicular to the surface 11a of the substrate 11, for example, is able to be exposed by cutting the silver layer 12 in a state of being cooled at an extremely low temperature using a cooling medium such as liquid nitrogen, or by cutting the silver layer 12 using a device cutting out a test piece such as a microtome. When the microtome is used, the sectional surface of the silver layer 12 is able to be exposed by being machined.

The shape of the silver layer 12 is not particularly limited, and for example, in a plan view of the laminate 1 looking at the surface 11a of the substrate 11 from the upper portion, the shape of the silver layer 12 is able to be arbitrarily set depending on the purpose.

The thickness of the silver layer 12 is able to be arbitrarily set depending on the purpose, is preferably 0.01 μm to 5 μm, and is more preferably 0.05 μm to 3 μm. By setting the thickness of the silver layer 12 to be greater than or equal to the lower limit value described above, it is possible to further improve conductivity, and it is possible to more stably maintain the structure of the silver layer 12. In addition, by setting the thickness of the silver layer 12 to be less than or equal to the upper limit value described above, it is possible to further thin the laminate 1.

The silver layer 12 may be formed of a single layer, or may be formed of a plurality of layers of two or more layers. When the silver layer 12 is formed of a plurality of layers, the plurality of layers may be identical to each other or different from each other, and the silver layer 12 is able to be configured similarly to the substrate 11. For example, in the conductive layer 12 formed of the plurality of layers, the total thickness of each of the layers may be the preferred thickness of the conductive layer 12 described above.

<Adhesion Layer>

The material of the adhesion layer 13 may be suitably adjusted depending on the type of the substrate 11, but is not particularly limited, and it is preferable that the material of the adhesion layer 13 is various types of resins or is formed by using a silane coupling agent.

In addition, there may be only one type or two or more types of the material of the adhesion layer 13, and when two or more types of the material of the adhesion layer 13 are used, the compounds combined and the ratio of each compound relative to the others can be arbitrarily adjusted depending on the purpose.

Among them, when the material of the adhesion layer 13 is the various types of resins, it is preferable that the adhesion layer 13 be formed by using an urethane acrylate resin, and it is more preferable that the adhesion layer 13 be formed by polymerizing the urethane acrylate resin.

It is preferable that the urethane acrylate resin used for forming the adhesion layer 13 be an urethane acrylate resin having a polycarbonate skeleton (hereinafter, referred to as a "polycarbonate skeleton-containing urethane acrylate resin").

In addition, when the material of the adhesion layer 13 is formed by using the silane coupling agent, it is preferable that the silane coupling agent be a compound denoted by General Formula (3) described below (hereinafter, referred to as "Compound (3)").

[Formula 1]

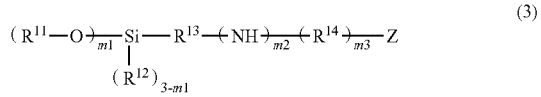

(In the formula, $R^{11}$ represents an alkyl group having 1 to 5 carbon atoms, an alkoxyalkyl group or an alkylcarbonyl group; $R^{12}$ represents an alkyl group having 1 to 5 carbon atoms or an aryl group having 6 to 12 carbon atoms; $R^{13}$ represents an alkylene group having 1 to 10 carbon atoms; $R^{14}$ represents an alkylene group having 1 to 5 carbon atoms, one or more methylene groups among the alkylene groups may be substituted with a carbonyl group; Z represents an amino group, a mercapto group, or an aryl group having 6 to 12 carbon atoms; m1 represents 2 or 3, a plurality of $R^{11}$ may be identical to each other or different from each other; m2 and m3 each independently represent 0 or 1, and when Z is an amino group, at least one of m2 and m3 represents 1)

(Compound (3))

Compound (3) is denoted by General Formula (3) described above.

In the formula, $R^{11}$ represents an alkyl group having 1 to 5 carbon atoms, an alkoxyalkyl group, or an alkylcarbonyl group.

The alkyl group of $R^{11}$ may be any one of a straight chain alkyl group, a branched chain alkyl group, and a cyclic alkyl group.

As the straight chain alkyl group or the branched chain alkyl group, a methyl group, an ethyl group, a n-propyl group, an isopropyl group, a n-butyl group, an isobutyl group, a sec-butyl group, a tert-butyl group, a n-pentyl group, an isopentyl group, a neopentyl group, a tert-pentyl group, a 1-methylbutyl group, a and 2-methylbutyl group are exemplary examples.

As the cyclic alkyl group, a cyclopropyl group, a cyclobutyl group, and a cyclopentyl group are exemplary examples.

The alkyl group of $R^{11}$ is preferably the straight chain alkyl group or the branched chain alkyl group, and preferably has 1 to 3 carbon atoms.

As the alkoxyalkyl group of $R^{11}$, an alkoxyalkyl group in which an alkoxy group configuring the alkoxyalkyl group is a monovalent group formed by bonding the alkyl group as $R^{11}$ to an oxygen atom, and an alkylene group to which the alkoxy group is bonded is a group formed by excluding one hydrogen atom from the alkyl group as $R^{11}$ is exemplary examples. Here, the total number of carbon atoms of the alkoxy group and the alkylene group (the number of carbon atoms of the alkoxyalkyl group) is 2 to 5.

The alkoxyalkyl group of $R^{11}$ is preferably a straight chain alkoxyalkyl group or a branched chain alkoxyalkyl group, preferably has carbon atoms of less than or equal to 3, and is more preferably a methoxymethyl group or a 2-methoxyethyl group.

As the alkyl carbonyl group of $R^{11}$, a monovalent group formed by bonding the alkyl group as $R^{11}$ to a carbon atom of a carbonyl group (—C(=O)—) is exemplary examples. Here, the number of carbon atoms of the alkyl group which is bonded to the carbon atom of the carbonyl group is 1 to 4 (the number of carbon atoms of the alkyl carbonyl group is 2 to 5).

The alkylcarbonyl group of $R^{11}$ is preferably a straight chain alkylcarbonyl group or a branched chain alkylcarbonyl group, preferably has carbon atoms of less than or equal to 3, and is more preferably a methylcarbonyl group (an acetyl group) or an ethylcarbonyl group.

In the formula, $R^{12}$ represents an alkyl group having 1 to 5 carbon atoms or an aryl group having 6 to 12 carbon atoms.

As the alkyl group of $R^{12}$, an alkyl group identical to the alkyl group of $R^{11}$ is exemplary examples, and the alkyl group of $R^{12}$ may be identical to or different from the alkyl group of $R^{11}$.

The aryl group of $R^{12}$ may be any one of a monocyclic aryl group and a polycyclic aryl group, and a phenyl group, a 1-naphthyl group, a 2-naphthyl group, an o-tolyl group, a m-tolyl group, a p-tolyl group, a xylyl group (a dimethylphenyl group), and the like are exemplary examples. In addition, one or more hydrogen atoms of these aryl groups may be substituted with an alkyl group and/or an alkoxy group. Here, as the alkyl group substituted with a hydrogen atom, an alkyl group identical to the alkyl group of $R^{11}$ is exemplary examples, and as the alkoxy group substituted with a hydrogen atom, a monovalent group formed by bonding the alkyl group of $R^{11}$ to an oxygen atom is exemplary examples. Then, when the aryl group is substituted with the alkyl group and/or the alkoxy group, the aryl group also includes the alkyl group and/or the alkoxy group, and has carbon atoms of less than or equal to 12.

The aryl group of $R^{12}$ is preferably a monocyclic aryl group, and is more preferably a phenyl group.

In the formula, $R^{13}$ represents an alkylene group having 1 to 10 carbon atoms, and in the present invention, the "alkylene group" includes a bivalent saturated hydrocarbon group such as a straight chain alkylene group, a branched chain alkylene group, and a cyclic alkylene group.

As the alkylene group of $R^{13}$, a bivalent group formed by excluding one hydrogen atom from an alkyl group having 1 to 10 carbon atoms is exemplary examples, and as the alkyl group, a methyl group, an ethyl group, a n-propyl group, an isopropyl group, a n-butyl group, an isobutyl group, a sec-butyl group, a tert-butyl group, a n-pentyl group, an isopentyl group, a neopentyl group, a tert-pentyl group, a 1-methylbutyl group, a n-hexyl group, a 2-methylpentyl group, a 3-methylpentyl group, a 2,2-dimethylbutyl group, a 2,3-dimethylbutyl group, a n-heptyl group, a 2-methylhexyl group, a 3-methylhexyl group, a 2,2-dimethylpentyl group, a 2,3-dimethylpentyl group, a 2,4-dimethylpentyl group, a 3,3-dimethylpentyl group, a 3-ethylpentyl group, a 2,2,3-trimethylbutyl group, a n-octyl group, an isooctyl group, a nonyl group, a decyl group, a cyclopropyl group, a cyclobutyl group, a cyclopentyl group, a cyclohexyl group, a cycloheptyl group, a cyclooctyl group, a cyclononyl group, a cyclodecyl group, a norbornyl group, an isobornyl group, a 1-adamantyl group, a 2-adamantyl group, and a tricyclodecyl group are exemplary examples.

The alkylene group of $R^{13}$ preferably has 1 to 7 carbon atoms, and more preferably has 1 to 5 carbon atoms, and as the alkylene group, specifically, a methylene group, an ethylene group, a propylene group (a methylethylene group), a trimethylene group, a tetramethylene group, a 1-methyltrimethylene group, a 2-methyltrimethylene group, a 1,2-dimethylethylene group, a 1,1-dimethylethylene group, an ethylethylene group, a pentamethylene group, a 1-methyltetramethylene group, a 2-methyltetramethylene group, a 1,1-dimethyltrimethylene group, a 1,2-dimethyltrimethylene group, a 1,3-dimethyltrimethylene group, a 1-ethyltrimethylene group, a 2-ethyltrimethylene group, a 1-methyl-2-ethylethylene group, a n-propylethylene group, and the like are exemplary examples.

In the formula, $R^{14}$ represents an alkylene group having 1 to 5 carbon atoms, the alkylene group of $R^{14}$ is identical to the alkylene group having 1 to 5 carbon atoms among the alkylene groups of $R^{13}$, and preferably has 1 to 3 carbon atoms.

In addition, the alkylene group of $R^{14}$ is a methylene group or is configured by connecting 2 to 5 methylene groups, and one or more methylene groups among the methylene groups (—$CH_2$—) configuring the alkylene group may be substituted with a carbonyl group (—C(=O)—). The number of methylene groups substituted with a carbonyl group depends on the total number of methylene groups in the alkylene group and is not particularly limited, and for example, $R^{14}$ may be configured only of a carbonyl group, may be a carbonyl group, or may be configured by mixing one or more alkylene groups with one or more carbonyl groups. Typically, the number of carbonyl groups in $R^{14}$ is preferably less than or equal to 2, and is more preferably 1.

In the formula, Z represents an amino group (—$NH_2$), a mercapto group (—SH), or an aryl group having 6 to 12 carbon atoms.

As the aryl group of Z, an aryl group identical to the aryl group of $R^{12}$ is exemplary examples, and the aryl group of Z may be identical to or different from the aryl group of $R^{12}$.

In the formula, m1 represents 2 or 3, and the plurality of $R^{11}$ may be identical to each other or different from each other.

In addition, m2 and m3 each independently represent 0 or 1. Here, when Z is an amino group, at least one of m2 and m3 represents 1 (both of m2 and m3 are not 0).

As particularly preferred Compound (3), a compound is exemplary examples in which $R^{11}$ and $R^{12}$ represents an alkyl group having 1 to 3 carbon atoms, $R^{13}$ represents an alkylene group having 1 to 5 carbon atoms, $R^{14}$ represents an alkylene group having 1 to 3 carbon atoms or a carbonyl group, and Z represents an amino group, a mercapto group, or a phenyl group. As such Compound (3), N-2-(aminoethyl)-3-aminopropyltrimethoxysilane (($CH_3O)_3Si(CH_2)_3NH(CH_2)_2NH_2$), N-2-(aminoethyl)-3-aminopropylmethyldimethoxysilane (($CH_3O)_2Si(CH_3)(CH_2)_3NH(CH_2)_2NH_2$), 3-ureidopropyltriethoxysilane (($CH_3CH_2O)_3Si(CH_2)_3NHC(=O)NH_2$), N-phenyl-3-aminopropyltrimethoxysilane (($CH_3O)_3Si(CH_2)_3NHC_6H_5$), 3-mercaptopropyltrimethoxysilane (($CH_3O)_3Si(CH_2)_3SH$), and 3-mercaptopropylmethyldimethoxysilane (($CH_3O)_2Si(CH_3)(CH_2)_3SH$) are exemplary examples.

Compound (3) is a silane coupling agent, and as Compound (3), a commercialized product may be used, and a compound which is synthesized by using a known method may be used.

One type or two or more types of Compounds (3) may be used in the formation of the adhesion layer 13, and when two or more types of Compounds (3) are used, the combination of the compounds and the ratio of the compounds to each other are not particularly limited.

The thickness of the adhesion layer 13 is able to be arbitrarily set depending on the purpose, is preferably 0.5 μm to 10 μm, and is more preferably 0.5 μm to 4 μm. By setting the thickness of the adhesion layer 13 to be greater than or equal to the lower limit value, the adhesiveness of the substrate 11 and the silver layer 12 is further improved. In addition, by setting the thickness of the adhesion layer 13 to be less than or equal to the upper limit value, it is possible to make the laminate 2 thin.

The adhesion layer 13 may be formed of a single layer, or may be formed of a plurality of layers of two or more layers.

When the adhesion layer 13 is formed of a plurality of layers, the plurality of layers may be identical to each other or different from each other, and the adhesion layer 13 is able to be configured similarly as the substrate 11. For example, when the adhesion layer 13 is formed of the plurality of layers, the total thickness of the respective layers may be the preferred thickness of the adhesion layer 13 described above.

«Manufacturing Method of Laminate»

The laminate according to the present invention, for example, is able to be manufactured by a manufacturing method including a step of forming the silver layer on the substrate.

Figure 3A:
FIG. 3A is a schematic sectional view for showing an example of a manufacturing method of the laminate according to the present invention.
Figure 3B:
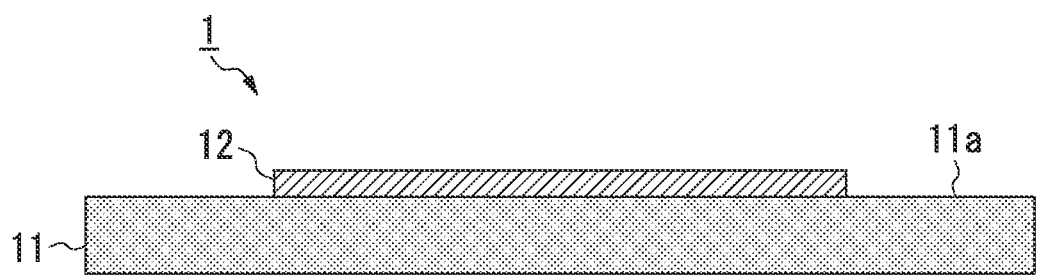
FIG. 3B is a schematic sectional view for showing an example of the manufacturing method of the laminate according to the present invention.

FIG. 3A and FIG. 3B are schematic sectional views for showing an example of a manufacturing method of the laminate 1 shown in FIG. 1.

[Step of Forming Silver Layer on Substrate]

In order to manufacture the laminate 1, as shown in FIG. 3A and FIG. 3B, the silver layer 12 is formed on the surface (one principal surface) 11a of the substrate 11.

It is preferable that the silver layer 12, for example, be formed by preparing a silver ink composition in which the forming material of the metal silver is blended therewith, by attaching the forming material of the metal silver to a desired portion on the surface 11a of the substrate 11, and by suitably selecting and performing a post-treatment such as a drying treatment or a heating (baking) treatment as necessary. The heat treatment may be performed along with the drying treatment.

In addition, the silver ink composition is attached to a predetermined portion on the surface 11a of the substrate 11 or the entire surface, and as necessary, the post-treatment such as the drying treatment or the heating (baking) treatment is suitably selected and performed, and thus the silver layer (the silver layer before being patterned, not shown) is formed, and then the silver layer is patterned into a desired shape by using a known method such as etching, and thus the silver layer 12 is able to be formed.

As the silver ink composition, a liquid silver ink composition is preferable, and a silver ink composition in which the forming material of the metal silver is dissolved or evenly dispersed is more preferable.

<Forming Material of Metal Silver>

The forming material of the metal silver may be a forming material which has a silver atom (a silver element) and generates metal silver due to a structural change such as decomposition, and as the forming material, a silver salt, a silver complex, an organic silver compound, and the like are exemplary examples. The silver salt and the silver complex may be either a silver compound having an organic group or a silver compound not having an organic group. Among them, as the forming material of the metal silver, the silver salt or the silver complex is preferable.

In addition, it is preferable that the forming material of the metal silver be a forming material which is decomposed by heating and forms metal silver.

By using the forming material of the metal silver, the metal silver is generated from the material, and the silver layer containing the metal silver is formed.

In the present invention, one of the forming materials of the metal silver may be independently used, or two or more thereof may be used in combination, and when two or more of the forming materials are used in combination, the compounds combined and the ratio of each compound relative to the others can be arbitrarily adjusted.

[Silver Carboxylate]

As the forming material of the metal silver, silver carboxylate having a group denoted by a formula "—COOAg" is exemplary examples.

The silver carboxylate is not particularly limited to the silver carboxylate having the group denoted by the formula "—COOAg". For example, the number of groups denoted by the formula "—COOAg" may be only one, or may be greater than or equal to 2. In addition, the position of the group denoted by the formula "—COOAg" in the silver carboxylate is also not particularly limited.

It is preferable that the silver carboxylate be one or more selected from a group consisting of silver β-ketocarboxylate denoted by General Formula (1) described below (hereinafter, referred to as "Silver β-Ketocarboxylate (1)") and silver carboxylate denoted by General Formula (4) described below (hereinafter, referred to as "Silver Carboxylate (4)").

Furthermore, herein, being simply referred to as the "silver carboxylate" indicates not only "Silver β-Ketocarboxylate (1)" and "Silver Carboxylate (4)", but also the "silver carboxylate having the group denoted by the formula "—COOAg"" including "Silver β-Ketocarboxylate (1)" and "Silver Carboxylate (4)", unless otherwise specified.

[Formula 2]

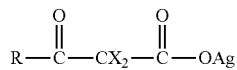

(1)

(in the formula, R represents an aliphatic hydrocarbon group having 1 to 20 carbon atoms or a phenyl group in which one or more hydrogen atoms may be substituted with a substituent group, a hydroxyl group, an amino group, or a group denoted by a general formula "$R^1$—$CY_2$—", "$CY_3$—", "$R^1$—CHY—", "$R^2O$—", "$R^5R^4N$—", "$(R^3O)_2$CY—", or "$R^6$—C(=O)—$CY_2$—";

Each Y independently represents a fluorine atom, a chlorine atom, a bromine atom, or a hydrogen atom; $R^1$ represents an aliphatic hydrocarbon group having 1 to 19 carbon atoms or a phenyl group; $R^2$ represents an aliphatic hydrocarbon group having 1 to 20 carbon atoms; $R^3$ represents an aliphatic hydrocarbon group having 1 to 16 carbon atoms; $R^4$ and $R^5$ each independently represent an aliphatic hydrocarbon group having 1 to 18 carbon atoms; $R^6$ represents an aliphatic hydrocarbon group having 1 to 19 carbon atoms, a hydroxyl group, or a group denoted by a formula "AgO—";

Each X independently represents a hydrogen atom, an aliphatic hydrocarbon group having 1 to 20 carbon atoms, a halogen atom, a phenyl group or a benzyl group in which one or more hydrogen atoms may be substituted with a substituent group, a cyano group, a N-phthaloyl-3-aminopropyl group, a 2-ethoxyvinyl group, or a group denoted by a general formula "$R^7O$—", "$R^7S$—", "$R^7$—C(=O)—", or "$R^7$—C(=O)—O—"; and $R^7$ represents an aliphatic hydrocarbon group having 1 to 10 carbon atoms, a thienyl group, or a phenyl group, or a diphenyl group in which one or more hydrogen atoms may be substituted with a substituent group.)

[Formula 3]

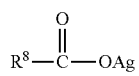

(4)

(in the formula, $R^8$ represents an aliphatic hydrocarbon group having 1 to 19 carbon atoms, a carboxyl group, or a group denoted by a formula "—C(=O)—OAg", and when the aliphatic hydrocarbon group has a methylene group, one or more methylene groups may be substituted with a carbonyl group)

(Silver β-Ketocarboxylate (1))

Silver β-Ketocarboxylate (1) is denoted by General Formula (1) described above.

In the formula, R represents an aliphatic hydrocarbon group having 1 to 20 carbon atoms or a phenyl group in which one or more hydrogen atoms may be substituted with a substituent group, a hydroxyl group, an amino group, or a group denoted by a general formula "$R^1$—$CY_2$—", "$CY_3$—", "$R^1$—CHY—", "$R^2O$—", "$R^5R^4N$—", "$(R^3O)_2$CY—", or "$R^6$—C(=O)—$CY_2$—";

The aliphatic hydrocarbon group having 1 to 20 carbon atoms of R may be any one of a straight chain aliphatic hydrocarbon group, a branched chain aliphatic hydrocarbon group, and a cyclic aliphatic hydrocarbon group (an alicyclic group), and when the aliphatic hydrocarbon group is the cyclic aliphatic hydrocarbon group, the cyclic aliphatic hydrocarbon group may be either a monocyclic aliphatic hydrocarbon group or a polycyclic aliphatic hydrocarbon group. In addition, the aliphatic hydrocarbon group may be either a saturated aliphatic hydrocarbon group or an unsaturated aliphatic hydrocarbon group. Then, the number of carbon atoms of the aliphatic hydrocarbon group is preferably 1 to 10, and is more preferably 1 to 6. As a preferred aliphatic hydrocarbon group of R, an alkyl group, an alkenyl group, and an alkynyl group are exemplary examples.

As the straight chain alkyl group or the branched chain alkyl group of R, a methyl group, an ethyl group, a n-propyl group, an isopropyl group, a n-butyl group, an isobutyl group, a sec-butyl group, a tert-butyl group, a n-pentyl group, an isopentyl group, a neopentyl group, a tert-pentyl group, a 1-methylbutyl group, a 2-methylbutyl group, a n-hexyl group, a 1-methylpentyl group, a 2-methylpentyl group, a 3-methylpentyl group, a 4-methylpentyl group, a 1,1-dimethylbutyl group, a 2,2-dimethylbutyl group, a 3,3-dimethylbutyl group, a 2,3-dimethylbutyl group, a 1-ethylbutyl group, a 2-ethylbutyl group, a 3-ethylbutyl group, a 1-ethyl-1-methylpropyl group, a n-heptyl group, a 1-methylhexyl group, a 2-methylhexyl group, a 3-methylhexyl group, a 4-methylhexyl group, a 5-methylhexyl group, a 1,1-dimethylpentyl group, a 2,2-dimethylpentyl group, a 2,3-dimethylpentyl group, a 2,4-dimethylpentyl group, a 3,3-dimethylpentyl group, a 4,4-dimethylpentyl group, a 1-ethylpentyl group, a 2-ethylpentyl group, a 3-ethylpentyl group, a 4-ethylpentyl group, a 2,2,3-trimethylbutyl group, a 1-propylbutyl group, a n-octyl group, an isooctyl group, a 1-methylheptyl group, a 2-methylheptyl group, a 3-methylheptyl group, a 4-methylheptyl group, a 5-methylheptyl group, a 1-ethylhexyl group, a 2-ethylhexyl group, a 3-ethylhexyl group, a 4-ethylhexyl group, a 5-ethylhexyl group, a 1,1-dimethylhexyl group, a 2,2-dimethylhexyl group, a 3,3-dimethylhexyl group, a 4,4-dimethylhexyl group, a 5,5-dimethylhexyl group, a 1-propylpentyl group, a 2-propylpentyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, and an icosyl group are exemplary examples.

As the cyclic alkyl group of R, a cyclopropyl group, a cyclobutyl group, a cyclopentyl group, a cyclohexyl group, a cycloheptyl group, a cyclooctyl group, a cyclononyl group, a cyclodecyl group, a norbornyl group, an isobornyl group, a 1-adamantyl group, a 2-adamantyl group, and a tricyclodecyl group are exemplary examples.

As the alkenyl group of R, a group is exemplary examples in which one single bond (C—C) between carbon atoms of the alkyl group of R is substituted with a double bond (C=C), such as a vinyl group (an ethenyl group, —CH=CH$_2$), an allyl group (a 2-propenyl group, —CH$_2$—CH=CH$_2$), a 1-propenyl group (—CH=CH—CH$_3$), an isopropenyl group (—C(CH$_3$)=CH$_2$), a 1-butenyl group (—CH=CH—CH$_2$—CH$_3$), a 2-butenyl group (—CH$_2$—CH=CH—CH$_3$), a 3-butenyl group (—CH$_2$—CH$_2$—CH=CH$_2$), a cyclohexenyl group, and a cyclopentenyl group.

As the alkynyl group of R, a group is exemplary examples in which one single bond (C—C) between the carbon atoms of the alkyl group of R is substituted with a triple bond (C≡C), such as an ethynyl group (—C≡CH), and a propargyl group (—CH$_2$—C≡CH).

In the aliphatic hydrocarbon group having 1 to 20 carbon atoms of R, one or more hydrogen atoms may be substituted with a substituent group, and as a preferred substituent group, a fluorine atom, a chlorine atom, and a bromine atom are exemplary examples. In addition, the number of substituent groups and the position thereof are not particularly limited. Then, when a plurality of substituent groups are used, the plurality of substituent groups may be identical to each other or different from each other. That is, all of the substituent groups may be identical to each other, all of the substituent groups may be different from each other, or only a part of the substituent groups may be different.

In the phenyl group of R, one or more hydrogen atoms may be substituted with a substituent group, and as a preferred substituent group, a saturated or unsaturated monovalent aliphatic hydrocarbon group having 1 to 16 carbon atoms, a monovalent group in which the aliphatic hydrocarbon group is bonded to an oxygen atom, a fluorine atom, a chlorine atom, a bromine atom, a hydroxyl group (—OH), a cyano group (—C≡N), a phenoxy group (—O—C$_6$H$_5$), and the like are exemplary examples, and the number of the substituent groups and the position thereof are not particularly limited. Then, when a plurality of substituent groups are used, the plurality of substituent groups may be identical to each other or different from each other.

As the aliphatic hydrocarbon group which is a substituent group, an aliphatic hydrocarbon group which is identical to the aliphatic hydrocarbon group of R is exemplary examples except that the aliphatic hydrocarbon group has 1 to 16 carbon atoms.

Y of R each independently represents a fluorine atom, a chlorine atom, a bromine atom, or a hydrogen atom. Then, in general formulas "R$^1$—CY$_2$—", "CY$_3$—", and "R$^6$—C(=O)—CY$_2$—", the respective plurality of Ys may be identical to each other or different from each other.

R$^1$ of R represents an aliphatic hydrocarbon group having 1 to 19 carbon atoms or a phenyl group (C$_6$H$_5$—), and as the aliphatic hydrocarbon group of R$^1$, an aliphatic hydrocarbon group which is identical to the aliphatic hydrocarbon group of R is an exemplary example except that the aliphatic hydrocarbon group has 1 to 19 carbon atoms.

R$^2$ of R represents an aliphatic hydrocarbon group having 1 to 20 carbon atoms, and as the aliphatic hydrocarbon group of R$^2$, an aliphatic hydrocarbon group which is identical to the aliphatic hydrocarbon group of R is an exemplary example.

R$^3$ of R represents an aliphatic hydrocarbon group having 1 to 16 carbon atoms, and as the aliphatic hydrocarbon group, an aliphatic hydrocarbon group which is identical to the aliphatic hydrocarbon group of R is an exemplary example except that the aliphatic hydrocarbon group has 1 to 16 carbon atoms.

R$^4$ and R$^5$ of R each independently represent an aliphatic hydrocarbon group having 1 to 18 carbon atoms. That is, R$^4$ and R$^5$ may be identical to each other or different from each other, and as the aliphatic hydrocarbon group, an aliphatic hydrocarbon group which is identical to the aliphatic hydrocarbon group of R is an exemplary example except that the aliphatic hydrocarbon group has 1 to 18 carbon atoms.

R$^6$ of R represents an aliphatic hydrocarbon group having 1 to 19 carbon atoms, a hydroxyl group, or a group denoted by a formula "AgO—", and as the aliphatic hydrocarbon group of R$^6$, an aliphatic hydrocarbon group which is identical to the aliphatic hydrocarbon group of R is an exemplary example except that the aliphatic hydrocarbon group has 1 to 19 carbon atoms.

Among them, it is preferable that R be a straight chain alkyl group or a branched chain alkyl group, a group denoted by a general formula "R$^6$—C(=O)—CY$_2$—", a hydroxyl group, or a phenyl group. Then, it is preferable that R$^6$ be a straight chain alkyl group or a branched chain alkyl group, a hydroxyl group, or a group denoted by a formula "AgO—".

In General Formula (1), X each independently represents a hydrogen atom, an aliphatic hydrocarbon group having 1 to 20 carbon atoms, a halogen atom, a phenyl group or a benzyl group (C$_6$H$_5$—CH$_2$—) in which one or more hydrogen atoms may be substituted with a substituent group, a cyano group, a N-phthaloyl-3-aminopropyl group, a 2-ethoxyvinyl group (C$_2$H$_5$—O—CH=CH—), or a group denoted by a general formula "R$^7$O—", "R$^7$S—", "R$^7$—C(=O)—", or "R$^7$—C(=O)—O—".

As the aliphatic hydrocarbon group having 1 to 20 carbon atoms of X, an aliphatic hydrocarbon group which is identical to the aliphatic hydrocarbon group of R is an exemplary example.

As the halogen atom of X, a fluorine atom, a chlorine atom, a bromine atom, and an iodine atom are exemplary examples.

In the phenyl group and the benzyl group of X, one or more hydrogen atoms may be substituted with a substituent group, and as a preferred substituent group, a halogen atom (a fluorine atom, a chlorine atom, a bromine atom, and an iodine atom), a nitro group (—NO$_2$), and the like are exemplary examples, and the number of substituent groups and the position thereof are not particularly limited. Then, when a plurality of substituent groups are used, the plurality of substituent groups may be identical to each other or different from each other.

R$^7$ of X represents an aliphatic hydrocarbon group having 1 to 10 carbon atoms, a thienyl group (C$_4$H$_3$S—), or a phenyl group or a diphenyl group (a biphenyl group, C$_6$H$_5$—C$_6$H$_4$—) in which one or more hydrogen atoms may be substituted with a substituent group. As the aliphatic hydrocarbon group of R$^7$, an aliphatic hydrocarbon group which is identical to the aliphatic hydrocarbon group of R is an exemplary example except that the aliphatic hydrocarbon group has 1 to 10 carbon atoms. In addition, as the substituent group of the phenyl group and the diphenyl group of R$^7$, a halogen atom (a fluorine atom, a chlorine atom, a bromine atom, and an iodine atom) and the like are exemplary examples, and the number of substituent groups and the position thereof are not particularly limited. Then, when a plurality of substituent groups are used, the plurality of substituent groups may be identical to each other or different from each other.

When $R^7$ is the thienyl group or the diphenyl group, a bonding position with respect to a group or an atom adjacent thereto in X (an oxygen atom, a sulfur atom, a carbonyl group, and a carbonyloxy group) is not particularly limited. For example, the thienyl group may be either a 2-thienyl group or a 3-thienyl group.

In General Formula (1), two Xs may be bonded as one group through a double bond with respect to a carbon atom which is interposed between two carbonyl groups, and in this case, a group denoted by a formula "=CH—$C_6H_4$—$NO_2$" is an exemplary example.

Among them, it is preferable that X be a hydrogen atom, a straight chain alkyl group or a branched chain alkyl group, a benzyl group, or a group denoted by a general formula "$R^7$—C(=O)—", and it is preferable that at least one of X be a hydrogen atom.

It is preferable that Silver β-Ketocarboxylate (1) be 2-methyl silver acetoacetate ($CH_3$—C(=O)—CH($CH_3$)—C(=O)—OAg), silver acetoacetate ($CH_3$—C(=O)—$CH_2$—C(=O)—OAg), silver 2-ethylacetoacetate ($CH_3$—C(=O)—CH($CH_2CH_3$)—C(=O)—OAg), propionyl silver acetate ($CH_3CH_2$—C(=O)—$CH_2$—C(=O)—OAg), silver isobutyrylacetate (($CH_3$)$_2$CH—C(=O)—$CH_2$—C(=O)—OAg), silver pivaloylacetate (($CH_3$)$_3$C—C(=O)—$CH_2$—C(=O)—OAg), silver 2-n-butylacetoacetate ($CH_3$—C(=O)—CH($CH_2CH_2CH_2CH_3$)—C(=O)—OAg), silver 2-benzylacetoacetate ($CH_3$—C(=O)—CH($CH_2C_6H_5$)—C(=O)—OAg), silver benzoylacetate ($C_6H_5$—C(=O)—$CH_2$—C(=O)—OAg), silver pivaloylacetoacetate (($CH_3$)$_3$C—C(=O)—$CH_2$—C(=O)—$CH_2$—C(=O)—OAg), silver isobutyrylacetoacetate (($CH_3$)$_2$CH—C(=O)—$CH_2$—C(=O)—$CH_2$—C(=O)—OAg), silver 2-acetylpivaloylacetate (($CH_3$)$_3$C—C(=O)—CH(—C(=O)—$CH_3$)—C(=O)—OAg), silver 2-acetylisobutyrylacetate (($CH_3$)$_2$CH—C(=O)—CH(—C(=O)—$CH_3$)—C(=O)—OAg), or silver acetonedicarboxylate (AgO—C(=O)—$CH_2$—C(=O)—$CH_2$—C(=O)—OAg), and it is more preferable that Silver β-Ketocarboxylate (1) be silver 2-methylacetoacetate, silver acetoacetate, silver 2-ethylacetoacetate, silver propionylacetate, silver isobutyrylacetate, silver pivaloylacetate, silver 2-n-butylacetoacetate, silver 2-benzylacetoacetate, silver benzoylacetate, silver pivaloylacetoacetate, silver isobutyrylacetoacetate, or silver acetonedicarboxylate.

Silver β-Ketocarboxylate (1) is able to further reduce the concentration of remaining raw materials or impurities in a conductive body (metal silver) which is formed by performing a post-treatment such as a drying treatment or a heating (baking) treatment. As the raw materials or the impurities become smaller, for example, contact between the formed metal silvers becomes excellent, conduction is easily obtained, and resistivity decreases.

As described below, even when a reducing agent or the like which is known in the field is not used, Silver β-Ketocarboxylate (1) is decomposed at a low temperature which is preferably 60° C. to 210° C., and is more preferably 60° C. to 200° C., and thus is able to form the metal silver. Then, by using the reducing agent together, Silver β-Ketocarboxylate (1) is decomposed at a lower temperature and forms the metal silver.

In the present invention, one of Silver β-Ketocarboxylates (1) may be independently used, or two or more thereof may be used in combination. When two or more of Silver β-Ketocarboxylates (1) are used in combination, the compounds combined and the ratio of each compound relative to the others can be arbitrarily adjusted.

(Silver Carboxylate (4))

Silver Carboxylate (4) is denoted by General Formula (4) described above.

In the formula, $R^8$ represents an aliphatic hydrocarbon group having 1 to 19 carbon atoms, a carboxyl group (—COOH), or a group denoted by a formula "—C(=O)—OAg".

As the aliphatic hydrocarbon group of $R^8$, an aliphatic hydrocarbon group which is identical to the aliphatic hydrocarbon group of R is an exemplary example except that the aliphatic hydrocarbon group has 1 to 19 carbon atoms. Here, in the aliphatic hydrocarbon group of $R^8$, the number of carbon atoms is preferably 1 to 15, and is more preferably 1 to 10.

When the aliphatic hydrocarbon group of $R^8$ has a methylene group (—$CH_2$—), one or more methylene groups may be substituted with a carbonyl group. The number of methylene groups which may be substituted with the carbonyl group and the position thereof are not particularly limited, and all of the methylene groups may be substituted with the carbonyl group. Here, the "methylene group" includes not only a single group denoted by a formula "—$CH_2$—", but also one group denoted by the formula "—$CH_2$—" in an alkylene group in which a plurality of groups denoted by a formula "—$CH_2$—" are connected.

It is preferable that Silver Carboxylate (4) be silver pyruvate ($CH_3$—C(=O)—C(=O)—OAg), silver acetate ($CH_3$—C(=O)—OAg), silver butyrate ($CH_3$—($CH_2$)$_2$—C(=O)—OAg), silver isobutyrate (($CH_3$)$_2$CH—C(=O)—OAg), silver 2-ethylhexanoate ($CH_3$—($CH_2$)$_3$—CH($CH_2CH_3$)—C(=O)—OAg), silver neodecanoate ($CH_3$—($CH_2$)$_5$—C($CH_3$)$_2$—C(=O)—OAg), silver oxalate (AgO—C(=O)—C(=O)—OAg), or silver malonate (AgO—C(=O)—$CH_2$—C(=O)—OAg). In addition, it is also preferable that among two groups denoted by a formula "—COOAg" of silver oxalate (AgO—C(=O)—C(=O)—OAg) and silver malonate (AgO—C(=O)—$CH_2$—C(=O)—OAg), one is a group denoted by a formula "—COOH" (HO—C(=O)—C(=O)—OAg, HO—C(=O)—$CH_2$—C(=O)—OAg).

As with Silver β-Ketocarboxylate (1), Silver Carboxylate (4) is also able to further reduce the concentration of the remaining raw materials or impurities in the conductive body (the metal silver) which is formed by performing a post-treatment such as a drying treatment or a heating (baking) treatment. Then, by using the reducing agent together, Silver Carboxylate (4) is decomposed at a lower temperature and forms the metal silver.

In the present invention, one of Silver Carboxylates (4) may be independently used, or two or more thereof may be used in combination. When two or more of Silver Carboxylates (4) are used in combination, the compounds combined and the ratio of each compound relative to the others can be arbitrarily adjusted.

In the silver ink composition, the content of silver derived from the forming material of the metal silver is preferably greater than or equal to 5 mass %, and is more preferably greater than or equal to 10 mass %. By setting the content to be in such a range, the formed silver layer (the metal silver) has more excellent quality. The upper limit value of the content of the silver is not particularly limited unless the effect of the present invention is impaired, and in consideration of handleability or the like, the upper limit value is preferably 25 mass %.

Furthermore, herein, the "silver derived from the forming material of the metal silver" indicates silver in the forming material of the metal silver which is blended therewith at the time of manufacturing the silver ink composition, unless otherwise specified, and is a concept including both silver which continuously configures the forming material of the metal silver after being blended therewith, and silver and silver itself in a decomposed material which is generated due to the decomposition of the forming material of the metal silver after being blended therewith.

[Nitrogen-Containing Compound]

In particular, when the forming material of the metal silver is the silver carboxylate, it is preferable that the silver ink composition be blended with one or more nitrogen-containing compounds selected from a group consisting of an amine compound and a quaternary ammonium salt having carbon atoms of less than or equal to 25, ammonia, and an ammonium salt which is formed by allowing the amine compound or the ammonia to react with an acid (hereinafter, simply referred to as a "nitrogen-containing compound") other than the forming material of the metal silver.

Hereinafter, the amine compound having carbon atoms of less than or equal to 25 is referred to as an "amine compound", the quaternary ammonium salt having carbon atoms of less than or equal to 25 is referred to as a "quaternary ammonium salt", the ammonium salt which is formed by allowing the amine compound having carbon atoms of less than or equal to 25 to react with an acid is referred to as an "ammonium salt derived from an amine compound", and the ammonium salt which is formed by allowing the ammonia to react with an acid is referred to as an "ammonium salt derived from ammonia".

(Amine Compound and Quaternary Ammonium Salt)

In the amine compound, the number of carbon atoms is 1 to 25, and as the amine compound, any one of primary amine, secondary amine, and tertiary amine may be used.

In addition, in the quaternary ammonium salt, the number of carbon atoms is 4 to 25. The amine compound and the quaternary ammonium salt may be either a chained quaternary ammonium salt or a cyclic quaternary ammonium salt. In addition, the number of nitrogen atoms (for example, a nitrogen atom configuring an amino group (—$NH_2$) of primary amine) configuring an amine portion or an ammonium salt portion may be 1 or may be greater than or equal to 2.

As the primary amine, monoalkylamine, monoarylamine, mono(heteroaryl)amine, diamine, and the like in which one or more hydrogen atoms may be substituted with a substituent group are exemplary examples.

An alkyl group configuring the monoalkylamine may be any one of a straight chain alkyl group, a branched chain alkyl group, and a cyclic alkyl group, and as the alkyl group, an alkyl group which is identical to the alkyl group of R is an exemplary example, and a straight chain alkyl group or a branched chain alkyl group having 1 to 19 carbon atoms, or a cyclic alkyl group having 3 to 7 carbon atoms is preferable.

As a preferred monoalkylamine, specifically, n-butylamine, n-hexylamine, n-octylamine, n-dodecylamine, n-octadecylamine, sec-butylamine, tert-butylamine, 3-aminopentane, 3-methylbutylamine, 2-aminooctane, 2-ethylhexylamine, and 1,2-dimethyl-n-propylamine are exemplary examples.

As an aryl group configuring the monoarylamine, a phenyl group, a 1-naphthyl group, a 2-naphthyl group, and the like are exemplary examples, and an aryl group having 6 to 10 carbon atoms is preferable.

As a heteroaryl group configuring the mono(heteroaryl) amine, a heteroaryl group having a hetero atom as an atom configuring an aromatic ring skeleton is included, and as the hetero atom, a nitrogen atom, a sulfur atom, an oxygen atom, and a boron atom are exemplary examples. In addition, the number of hetero atoms configuring the aromatic ring skeleton is not particularly limited, but may be 1, or may be greater than or equal to 2. When two or more hetero atoms are used, these hetero atoms may be identical to each other or different from each other. That is, all of the hetero atoms may be identical to each other, all of the hetero atoms may be different from each other, or only a part of the hetero atoms may be different.

The heteroaryl group may be either a monocyclic heteroaryl group or a polycyclic heteroaryl group, the number of membered rings (the number of atoms configuring a ring skeleton) is also not particularly limited, but it is preferable that the number of membered rings be 3 to 12.

In the heteroaryl group, as a monocyclic heteroaryl group having 1 to 4 nitrogen atoms, a pyrrolyl group, a pyrrolinyl group, an imidazolyl group, a pyrazolyl group, a pyridyl group, a pyrimidyl group, a pyrazinyl group, a pyridazinyl group, a triazolyl group, a tetrazolyl group, a pyrrolidinyl group, an imidazolidinyl group, a piperidinyl group, a pyrazolidinyl group, and a piperazinyl group are exemplary examples, and the number of membered rings is preferably 3 to 8, and is more preferably 5 to 6.

In the heteroaryl group, as a monocyclic heteroaryl group having one oxygen atom, a furanyl group is an exemplary example, and the number of membered rings is preferably 3 to 8, and is more preferably 5 to 6.

In the heteroaryl group, as a monocyclic heteroaryl group having one sulfur atom, a thienyl group is an exemplary example, and the number of membered rings is preferably 3 to 8, and is more preferably 5 to 6.

In the heteroaryl group, as a monocyclic heteroaryl group having 1 to 2 oxygen atoms and 1 to 3 nitrogen atoms, an oxazolyl group, an isoxazolyl group, an oxadiazolyl group, and a morpholinyl group are exemplary examples, and the number of membered rings is preferably 3 to 8, and is more preferably 5 to 6.

In the heteroaryl group, as a monocyclic heteroaryl group having 1 to 2 sulfur atoms and 1 to 3 nitrogen atoms, a thiazolyl group, a thiadiazolyl group, and a thiazolidinyl group are exemplary examples, and the number of membered rings is preferably 3 to 8, and is more preferably 5 to 6.

In the heteroaryl group, as a polycyclic heteroaryl group having 1 to 5 nitrogen atoms, an indolyl group, an isoindolyl group, an indolidinyl group, a benzimidazolyl group, a quinolyl group, an isoquinolyl group, an indazolyl group, a benzotriazolyl group, a tetrazolopyridyl group, a tetrazolopyridazinyl group, and a dihydrotriazolopyridazinyl group are exemplary examples, and the number of membered rings is preferably 7 to 12, and is more preferably 9 to 10.

In the heteroaryl group, as a polycyclic heteroaryl group having 1 to 3 sulfur atoms, a dithianaphthalenyl group, and a benzothiophenyl group are exemplary examples, and the number of membered rings is preferably 7 to 12, and is more preferably 9 to 10.

In the heteroaryl group, as a polycyclic heteroaryl group having 1 to 2 oxygen atoms and 1 to 3 nitrogen atoms, a benzoxazolyl group, and a benzoxadiazolyl group are exemplary examples, and the number of membered rings is preferably 7 to 12, and is more preferably 9 to 10.

In the heteroaryl group, as a polycyclic heteroaryl group having 1 to 2 sulfur atoms and 1 to 3 nitrogen atoms, a benzothiazolyl group, and a benzothiadiazolyl group are exemplary examples, and the number of membered rings is preferably 7 to 12, and is more preferably 9 to 10.

The diamine may have two amino groups, and the positional relationship of the two amino groups is not particularly limited. As preferred diamine, diamine is an exemplary example in which one hydrogen atom other than the hydrogen atom configuring an amino group (—NH$_2$) is substituted with an amino group in the monoalkylamine, the monoarylamine, or the mono(heteroaryl)amine.

It is preferable that the number of carbon atoms in the diamine be 1 to 10, and as more preferred diamine, ethylenediamine, 1,3-diaminopropane, and 1,4-diaminobutane are exemplary examples.

As the secondary amine, dialkylamine, diarylamine, di(heteroaryl)amine, and the like in which one or more hydrogen atoms may be substituted with a substituent group are exemplary examples.

An alkyl group configuring the dialkylamine is identical to the alkyl group configuring the monoalkylamine, and as the alkyl group, a straight chain alkyl group or a branched chain alkyl group having 1 to 9 carbon atoms, or a cyclic alkyl group having 3 to 7 carbon atoms is preferable. In addition, two alkyl groups in one molecule of dialkylamine may be identical to each other or different from each other.

As preferred dialkylamine, specifically, N-methyl-n-hexylamine, diisobutylamine, and di(2-ethylhexyl)amine are exemplary examples.

An aryl group configuring the diarylamine is identical to the aryl group configuring the monoarylamine, and as the aryl group, an aryl group having 6 to 10 carbon atoms is preferable. In addition, two aryl groups in one molecule of diarylamine may be identical to each other or different from each other.

A heteroaryl group configuring the di(heteroaryl)amine is identical to the heteroaryl group configuring the mono(heteroaryl)amine, and it is preferable that the number of membered rings is 6 to 12. In addition, two heteroaryl groups in one molecule of di(heteroaryl)amine may be identical to each other or different from each other.

As the tertiary amine, trialkylamine, dialkylmonoarylamine, and the like in which one or more hydrogen atoms may be substituted with a substituent group are exemplary examples.

An alkyl group configuring the trialkylamine is identical to the alkyl group configuring the monoalkylamine, and as the alkyl group, a straight chain alkyl group or a branched chain alkyl group having 1 to 19 carbon atoms, or a cyclic alkyl group having 3 to 7 carbon atoms is preferable. In addition, three alkyl groups in one molecule of trialkylamine may be identical to each other or different from each other. That is, all of the three alkyl groups may be identical to each other, all of the three alkyl groups may be different from each other, or only a part of the three alkyl groups may be different.

As preferred trialkylamine, specifically, N,N-dimethyl-n-octadecylamine, and N,N-dimethylcyclohexylamine are exemplary examples.

An alkyl group configuring the dialkylmonoarylamine is identical to the alkyl group configuring the monoalkylamine, and as the alkyl group, a straight chain alkyl group or a branched chain alkyl group having 1 to 6 carbon atoms, or a cyclic alkyl group having 3 to 7 carbon atoms is preferable. In addition, two alkyl groups in one molecule of dialkylmonoarylamine may be identical to each other or different from each other.

An aryl group configuring the dialkylmonoarylamine is identical to the aryl group configuring the monoarylamine, and as the aryl group, an aryl group having 6 to 10 carbon atoms is preferable.

In the present invention, as the quaternary ammonium salt, a halogenated tetraalkylammonium or the like in which one or more hydrogen atoms may be substituted with a substituent group is an exemplary example.

An alkyl group configuring the halogenated tetraalkylammonium is identical to the alkyl group configuring the monoalkylamine, and as the alkyl group, an alkyl group having 1 to 19 carbon atoms is preferable. In addition, four alkyl groups in one molecule of halogenated tetraalkylammonium may be identical to each other or different from each other. That is, all of the four alkyl groups may be identical to each other, all of the four alkyl groups may be different from each other, or only a part of the four alkyl groups may be different.

As halogen configuring the halogenated tetraalkylammonium, fluorine, chlorine, bromine, and iodine are exemplary examples.

As preferred halogenated tetraalkylammonium, specifically, dodecyltrimethyl ammonium bromide is an exemplary example.

In addition, a chained amine compound and a quaternary organic ammonium salt are mainly described, but the amine compound and the quaternary ammonium salt may be a heterocyclic compound in which a nitrogen atom configuring an amine portion or an ammonium salt portion is a part of a ring skeleton structure (a heterocyclic skeleton structure). That is, the amine compound may be cyclic amine, and the quaternary ammonium salt may be a cyclic ammonium salt. At this time, a ring (a ring including the nitrogen atom configuring the amine portion or the ammonium salt portion) structure may be either monocyclic structure or a polycyclic monocyclic structure, the number of membered rings (the number of atoms configuring the ring skeleton) is also not particularly limited, and the ring may be either an aliphatic ring or an aromatic ring.

When the amine compound is the cyclic amine, as a preferred example thereof, pyridine is an exemplary example.

In the primary amine, the secondary amine, the tertiary amine, and the quaternary ammonium salt, a "hydrogen atom which may be substituted with a substituent group" is a hydrogen atom other than the hydrogen atom which is bonded to the nitrogen atom configuring the amine portion or the ammonium salt portion. At this time, the number of substituent groups is not particularly limited, may be 1, or may be greater than or equal to 2, and all of the hydrogen atoms may be substituted with a substituent group. When a plurality of substituent groups are used, the plurality of substituent groups may be identical to each other or different from each other. That is, all of the plurality of substituent groups may be identical to each other, all of the plurality of substituent groups may be different from each other, or only a part of the plurality of substituent groups may be different. In addition, the position of the substituent group is also not particularly limited.

As the substituent group of the amine compound and the quaternary ammonium salt, an alkyl group, an aryl group, a halogen atom, a cyano group, a nitro group, a hydroxyl group, a trifluoromethyl group (—CF$_3$), and the like are exemplary examples. Here, as the halogen atom, a fluorine atom, a chlorine atom, a bromine atom, and an iodine atom are exemplary examples.

When the alkyl group configuring the monoalkylamine has a substituent group, as the alkyl group, a straight chain alkyl group or a branched chain alkyl group which has an aryl group as a substituent group and has 1 to 9 carbon atoms, or a cyclic alkyl group which preferably has an alkyl group having 1 to 5 carbon atoms as a substituent group and has 3 to 7 carbon atoms is preferable, and as the monoalkylamine having a substituent group, specifically, 2-phenylethylamine, benzylamine, and 2,3-dimethylcyclohexylamine are exemplary examples.

In addition, in the aryl group and the alkyl group which are substituent groups, one or more hydrogen atoms may be further substituted with a halogen atom, and as the monoalkylamine having a substituent group which is substituted with such a halogen atom, 2-bromobenzylamine is an exemplary example. Here, as the halogen atom, a fluorine atom, a chlorine atom, a bromine atom, and an iodine atom are exemplary examples.

When the aryl group configuring the monoarylamine has a substituent group, as the aryl group, an aryl group which has a halogen atom as a substituent group and has 6 to 10 carbon atoms is preferable, and as the monoarylamine having such a substituent group, specifically, bromophenylamine is an exemplary example. Here, as the halogen atom, a fluorine atom, a chlorine atom, a bromine atom, and an iodine atom are exemplary examples.

When the alkyl group configuring the dialkylamine has a substituent group, as the alkyl group, a straight chain alkyl group or a branched chain alkyl group which has a hydroxyl group or an aryl group as a substituent group and has 1 to 9 carbon atoms is preferable, and as the dialkylamine having such a substituent group, specifically, diethanolamine, and N-methylbenzylamine are exemplary examples.

It is preferable that the amine compound be n-propylamine, n-butylamine, n-hexylamine, n-octylamine, n-dodecylamine, n-octadecylamine, sec-butylamine, tert-butylamine, 3-aminopentane, 3-methylbutylamine, 2-aminooctane, 2-ethylhexylamine, 2-phenylethylamine, ethylenediamine, 1,3-diaminopropane, 1,4-diaminobutane, N-methyl-n-hexylamine, diisobutylamine, N-methylbenzylamine, di(2-ethylhexyl)amine, 1,2-dimethyl-n-propylamine, N,N-dimethyl-n-octadecylamine, or N,N-dimethylcyclohexylamine.

In addition, as described below, when carbon dioxide is supplied and the silver ink composition is prepared, the components of the silver ink composition (a second mixture) are more evenly dispersed at the time of supplying the carbon dioxide, and the quality is stabilized, and thus it is preferable that the amine compound have a branched chain alkyl group.

(Ammonium Salt Derived from Amine Compound)

In the present invention, the ammonium salt derived from the amine compound is an ammonium salt which is formed by allowing the amine compound to react with an acid, and the acid may be an inorganic acid such as a hydrochloric acid, a sulfuric acid, and a nitric acid, or may be an organic acid such as an acetic acid, and the type of the acid is not particularly limited.

As the ammonium salt derived from amine compound, a n-propylamine hydrochloride salt, a N-methyl-n-hexylamine hydrochloride salt, a N,N-dimethyl-n-octadecylamine hydrochloride salt, and the like are exemplary examples, but the ammonium salt is not limited thereto.

(Ammonium Salt Derived from Ammonia)

In the present invention, the ammonium salt derived from the ammonia is an ammonium salt which is formed by allowing the ammonia to react with an acid, and here, as the acid, the same acids as that in the ammonium salt derived from the amine compound are exemplary examples.

As the ammonium salt derived from the ammonia, ammonium chloride is an exemplary example, but the ammonium salt is not limited thereto.

In the present invention, one of the amine compound, the quaternary ammonium salt, the ammonium salt derived from the amine compound, and the ammonium salt derived from the ammonia may be independently used, and two or more thereof may be used in combination. When two or more thereof are used in combination, the compounds combined and the ratio of each compound relative to the others can be arbitrarily adjusted.

Then, as the nitrogen-containing compound, one selected from a group consisting of the amine compound, the quaternary ammonium salt, the ammonium salt derived from the amine compound, and the ammonium salt derived from the ammonia may be independently used, or two or more selected therefrom may be used in combination. When two or more selected therefrom are used in combination, the compounds combined and the ratio of each compound relative to the others can be arbitrarily adjusted.

In the silver ink composition, the blended amount of the nitrogen-containing compound is preferably 0.2 mol to 15 mol, and is more preferably 0.3 mol to 5 mol, per 1 mol of the blended amount of the silver carboxylate.

By regulating the blended amount of the nitrogen-containing compound as described above, the stability of the silver ink composition is further improved, and the quality of the silver layer (the metal silver) is further improved. Further, even when the heat treatment is not performed at a high temperature, it is possible to more stably form the conductive layer.

[Reducing Agent]

It is preferable that the silver ink composition be further blended with a reducing agent in addition to the forming material of the metal silver. By being blended with the reducing agent, the silver ink composition is able to more easily form the metal silver, and for example, is able to form the silver layer (the metal silver) having sufficient conductivity even when the heat treatment is performed at a low temperature.

It is preferable that the reducing agent be one or more reducing compounds (hereinafter, simply referred to as a "reducing compound") selected from a group consisting of oxalate, hydrazine, and a compound denoted by General Formula (5) described below (hereinafter, referred to as "Compound (5)").

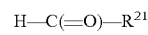
 (5)

(in the formula, $R^{21}$ represents an alkyl group having carbon atoms of less than or equal to 20, an alkoxy group or a N,N-dialkylamino group, and a hydroxyl group or an amino group.)

(Reducing Compound)

The reducing compound is one or more selected from a group consisting of the oxalic acid (HOOC—COOH), the hydrazine ($H_2N$—$NH_2$), and the compound denoted by General Formula (5) described above (Compound (5)). That is, only one of the reducing compounds to be blended therewith may be used, or two or more thereof may be used, and when two or more of the reducing compounds are used in combination, the compounds combined and the ratio of each compound relative to the others can be arbitrarily adjusted.

In the formula, $R^{21}$ represents an alkyl group having carbon atoms of less than or equal to 20, an alkoxy group or a N,N-dialkylamino group, and a hydroxyl group or an amino group.

The alkyl group having carbon atoms of less than or equal to 20 of $R^{21}$ may be any one of a straight chain alkyl group, a branched chain alkyl group, and a cyclic alkyl group having 1 to 20 carbon atoms, and as the alkyl group, an alkyl group which is identical to the alkyl group of R denoted by General Formula (1) described above is an exemplary example.

The alkoxy group having carbon atoms of less than or equal to 20 of $R^{21}$ is an alkoxy group having 1 to 20 carbon atoms, and as the alkoxy group, a monovalent group in which the alkyl group of $R^{21}$ is bonded to an oxygen atom is an exemplary example.

The N,N-dialkylamino group having carbon atoms of less than or equal to 20 of $R^{21}$ is a N,N-dialkylamino group having 2 to 20 carbon atoms, two alkyl groups bonded to a nitrogen atom may be identical to each other or different from each other, and in each of the alkyl groups, the number of carbon atoms is 1 to 19. Here, the total number of carbon atoms of the two alkyl groups is 2 to 20.

Each of the alkyl groups bonded to the nitrogen atom may be any one of a straight chain alkyl group or a branched chain alkyl group, and a cyclic alkyl group, and as the alkyl group, an alkyl group which is identical to the alkyl group of R denoted by General Formula (1) described above is an exemplary example, except that the number of carbon atoms is 1 to 19.

As the reducing compound, the hydrazine may use monohydrate ($H_2N-NH_2 \cdot H_2O$).

It is preferable that the reducing compound be formic acid ($H-C(=O)-OH$), methyl formate ($H-C(=O)-OCH_3$), ethyl formate ($H-C(=O)-OCH_2CH_3$), butyl formate ($H-C(=O)-O(CH_2)_3CH_3$), propanal ($H-C(=O)-CH_2CH_3$), butanal ($H-C(=O)-(CH_2)_2CH_3$), hexanal ($H-C(=O)-(CH_2)_4CH_3$), formamide ($H-C(=O)-NH_2$), N,N-dimethylformamide ($H-C(=O)-N(CH_3)_2$), or oxalic acid.

In the silver ink composition, the blended amount of the reducing agent is preferably 0.04 mol to 3.5 mol, and is more preferably 0.06 mol to 2.5 mol, per 1 mol of the blended amount of the forming material of the metal silver. By regulating the blended amount as described above, the silver ink composition is able to more easily and more stably form the silver layer.

[Alcohol]

It is preferable that the silver ink composition be further blended with alcohol in addition to the forming material of the metal silver.

It is preferable that the alcohol be acetylene alcohols (hereinafter, referred to as "Acetylene Alcohol (2)") denoted by General Formula (2) described below.

[Formula 4]

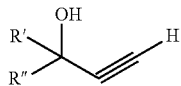

(2)

(in the formula, R' and R" each independently represents an alkyl group having 1 to 20 carbon atoms, or a phenyl group in which one or more hydrogen atoms may be substituted with a substituent group)

(Acetylene Alcohol (2))

Acetylene Alcohol (2) is denoted by General Formula (2) described above.

In the formula, R' and R" each independently represents an alkyl group having 1 to 20 carbon atoms, or a phenyl group in which one or more hydrogen atoms may be substituted with a substituent group.

The alkyl group having 1 to 20 carbon atoms of R' and R" may be any one of a straight chain alkyl group, a branched chain alkyl group, and a cyclic alkyl group, and when the alkyl group is the cyclic alkyl group, the cyclic alkyl group may be either a monocyclic alkyl group or a polycyclic alkyl group. As the alkyl group of R' and R", an alkyl group which is identical to the alkyl group of R is an exemplary example.

As the substituent group with which the hydrogen atom of the phenyl group of R' and R" may be substituted, a saturated or unsaturated monovalent aliphatic hydrocarbon group having 1 to 16 carbon atoms, a monovalent group in which the aliphatic hydrocarbon group is bonded to an oxygen atom, a fluorine atom, a chlorine atom, a bromine atom, a hydroxyl group, a cyano group, a phenoxy group, and the like are exemplary examples, and the substituent group is identical to the substituent group with which the hydrogen atom of the phenyl group of R may be substituted. Then, the number of substituent groups and the position thereof are not particularly limited, and when a plurality of substituent groups are used, the plurality of substituent groups may be identical to each other or different from each other.

It is preferable that R' and R" represent an alkyl group having 1 to 20 carbon atoms, and it is more preferable that R' and R" represent a straight chain alkyl group or a branched chain alkyl group having 1 to 10 carbon atoms.

As preferred Acetylene Alcohol (2), 3,5-dimethyl-1-hexyne-3-ol, 3-methyl-1-butyne-3-ol, and 3-methyl-1-pentyne-3-ol are exemplary examples.

When Acetylene Alcohol (2) is used, in the silver ink composition, the blended amount of Acetylene Alcohol (2) is preferably 0.03 mol to 0.7 mol, and is more preferably 0.05 mol to 0.3 mol per 1 mol of the blended amount of the forming material of the metal silver. By setting the blended amount to be in such a range, the stability of the silver ink composition is further improved.

One of the alcohols may be independently used, or two or more thereof may be used in combination. When two or more of the alcohols are used in combination, the compounds combined and the ratio of each compound relative to the others can be arbitrarily adjusted.

The silver ink composition may be blended with other components in addition to the forming material of the metal silver, the nitrogen-containing compound, the reducing agent, and the alcohol.

The other component in the silver ink composition is able to be arbitrarily selected depending on the purpose and is not particularly limited, and as a preferred example thereof, a solvent other than the alcohol is able to be exemplified, and the other component is able to be arbitrarily selected depending on the type or the amount of the blended component.

One of the other components in the silver ink composition may be independently used, or two or more thereof may be used in combination. When two or more of the other components are used in combination, the compounds combined and the ratio of each compound relative to the others can be arbitrarily adjusted.

In the silver ink composition, the ratio of the blended amount of the other component to the total amount of the blended components is preferably less than or equal to 10 mass %, and is more preferably less than or equal to 5 mass %.

All of the components in the silver ink composition may be dissolved, or a part or all of the components may not be dissolved, and it is preferable that the components which are not dissolved are evenly dispersed.

The silver ink composition is obtained by blending the forming material of the metal silver with the components other than the forming material of the metal silver.

When the respective components are blended together, all of the components may be added and mixed, a part of the components may be mixed while being sequentially added, or all of the components may be mixed while being sequentially added.

A mixing method is not particularly limited, and may be suitably selected from known methods such as a method of mixing the components by rotating a stirring element, a stirring blade, or the like; a method of mixing the components using a mixer; and a method of mixing the components by applying ultrasonic waves thereto.

The temperature at the time of blending the components with each other is not particularly limited unless each of the blended components is degraded, and is preferably −5° C. to 60° C.

In addition, a blending time (a mixing time) is also not particularly limited unless each of the blended components is degraded, and is preferably 5 minutes to 5 hours.

[Carbon Dioxide]

The silver ink composition may be formed by further supplying carbon dioxide thereto. Such a silver ink composition has high viscosity, and for example, it is preferable that the silver ink composition be applied to a printing method in which it is necessary to thicken ink, such as a flexo printing method, a screen printing method, a gravure printing method, a gravure offset printing method, and a pad printing method.

The carbon dioxide may be supplied at any time point while the silver ink composition is manufactured.

Then, in the present invention, for example, it is preferable that the carbon dioxide be supplied to a first mixture in which the forming material of the metal silver is blended with the nitrogen-containing compound, and thus a second mixture is obtained, and as necessary, the second mixture is further blended with the reducing agent, and thus the silver ink composition is manufactured. In addition, when the alcohol or the other component is blended therewith, the alcohol or the other component is able to be blended therewith at the time of manufacturing any one or both of the first mixture and the second mixture, and is able to be arbitrarily selected depending on the purpose.

The first mixture is able to be manufactured by the same method as that of the silver ink composition except that the blended component is different.

In the first mixture, all of the blended components may be dissolved or a part of the components may be dispersed without being dissolved, it is preferable that all of the blended components be dissolved, and it is preferable that the components which are not dissolved be evenly dispersed.

A blending temperature at the time of manufacturing the first mixture is not particularly limited unless each of the blended component is degraded, and is preferably −5° C. to 30° C. In addition, a blending time may be suitably adjusted depending on the type of the blended component or the temperature at the time of being blended therewith, and for example, is preferably 0.5 hours to 12 hours.

The carbon dioxide ($CO_2$) supplied to the first mixture may be in the form of either gas or solid (dry ice), or may be in the form of both of gas and solid. It is assumed that the carbon dioxide penetrates into the first mixture and acts on the components in the first mixture by supplying the carbon dioxide, and thus the viscosity of the second mixture to be obtained increases.

The carbon dioxide gas may be supplied by various known methods of injecting gas into a liquid, and a suitable supply method may be suitably selected. For example, a method is an exemplary example in which one end of a pipe is dipped in the first mixture, and the other end is connected to a supply source of carbon dioxide gas, and thus the carbon dioxide gas is supplied to the first mixture through the pipe. At this time, the carbon dioxide gas may be directly supplied from an end portion of the pipe, and for example, a gas diffusion member in which a plurality of gap portions such as pores which are able to be a flow path of the gas are disposed, and thus the introduced gas is able to be diffused and is able to be discharged as fine air bubbles may be connected to the end portion of the pipe, and the carbon dioxide gas may be supplied through the gas diffusion member. In addition, the carbon dioxide gas may be supplied by the same method as that at the time of manufacturing the first mixture while stirring the first mixture. Thus, it is possible to efficiently supply the carbon dioxide.

The supplied amount of the carbon dioxide gas may be suitably adjusted depending on the amount of the first mixture of a supply destination, an aimed silver ink composition, or the viscosity of the second mixture, and is not particularly limited. For example, in order to obtain approximately 100 g to 1000 g of a silver ink composition having viscosity of greater than or equal to 5 Pa·s at 20° C. to 25° C., it is preferable that the carbon dioxide gas of greater than or equal to 100 is supplied, and it is more preferable that the carbon oxide gas of greater than or equal to 200 be supplied. Furthermore, here, the viscosity of the silver ink composition at 20° C. to 25° C. is described, and the temperature at the time of using the silver ink composition is not limited to 20° C. to 25° C., and is able to be arbitrarily selected.

The flow rate of the carbon dioxide gas may be suitably adjusted in consideration of the necessary supplied amount of the carbon dioxide gas, is preferably greater than or equal to 0.5 mL/minute, and is more preferably greater than or equal to 1 mL/minute, per 1 g of the first mixture 1 g. The upper limit value of the flow rate is not particularly limited, and in consideration of handleability or the like, is preferably 40 mL/minute per 1 g of the mixture.

Then, the supply time of the carbon dioxide gas may be suitably adjusted in consideration of the necessary supplied amount or the flow rate of the carbon dioxide gas.

The temperature of the first mixture at the time of supplying the carbon dioxide gas is preferably 5° C. to 70° C., is more preferably 7° C. to 60° C., and is particularly preferably 10° C. to 50° C. By setting the temperature to be greater than or equal to the lower limit value, it is possible to more efficiently supply the carbon dioxide, and by setting the temperature to be less than or equal to the upper limit value, it is possible to obtain a silver ink composition having fewer impurities and excellent quality.

The flow rate and the supply time of the carbon dioxide gas, and the temperature at the time of supplying the carbon dioxide gas may be adjusted to be in a suitable range while mutually considering the respective values. For example, by setting the flow rate of the carbon dioxide gas to be high or by setting the supply time of the carbon dioxide gas to be long, or by performing both settings, it is possible to efficiently supply the carbon dioxide even when the temperature is set to be low. In addition, by setting the temperature to be high or by setting the supply time of the carbon dioxide gas to be long, or by performing both settings, it is possible to efficiently supply the carbon dioxide even when the flow rate of the carbon dioxide gas is set to be low. That is, the numerical values in the numerical value range which are exemplified as the flow rate of the carbon dioxide gas and the temperature at the time of supplying the carbon dioxide gas are flexibly combined while also considering the supply time of the carbon dioxide gas, and thus it is possible to efficiently obtain a silver ink composition with excellent quality.

It is preferable that the carbon dioxide gas be supplied while the first mixture is stirred. Thus, the supplied carbon dioxide gas is able to be more evenly diffused in the first mixture, and thus the carbon dioxide is able to be more efficiently supplied.

At this time, a stirring method may be identical to that in the mixing method at the time of manufacturing the silver ink composition described above not using the carbon dioxide.

The dry ice (solid carbon dioxide) may be supplied by adding the dry ice to the first mixture. The total amount of dry ice may be collectively added, or may be gradually added (continuously added by interposing a time zone in which the dry ice is not added) by being divided.

The used amount of the dry ice may be adjusted in consideration of the supplied amount of the carbon dioxide gas.

It is preferable that the first mixture be stirred during and after the dry ice is added, and for example, it is preferable that the first mixture be stirred by using the same method as that at the time of manufacturing the silver ink composition described above not using the carbon dioxide. Thus, it is possible to efficiently supply the carbon dioxide.

The temperature at the time of stirring the first mixture may be identical to the temperature at the time of supplying the carbon dioxide gas. In addition, the stirring time may be suitably adjusted depending on the stirring temperature.

The viscosity of the second mixture may be suitably adjusted depending on the purpose such as a handling method of the silver ink composition or the second mixture, but is not particularly limited. For example, when the silver ink composition is applied to a printing method using high viscosity ink such a screen printing method, and a flexo printing method, it is preferable that the viscosity of the second mixture at 20° C. to 25° C. be greater than or equal to 3 Pa·s. Furthermore, here, the viscosity of the second mixture at 20° C. to 25° C. is described, but the temperature at the time of using the second mixture is not limited to 20° C. to 25° C., and is able to be arbitrarily selected.

The second mixture is further blended with one or more selected from a group consisting of the reducing agent, the alcohol, and the other component, as necessary, and thus a silver ink composition is able to be obtained.

At this time, the silver ink composition is able to be manufactured by the same method as that in the silver ink composition described above not using the carbon dioxide except that the blended component is different. Then, in the obtained silver ink composition, all of the blended components may be dissolved or a part of the components may be dispersed without being dissolved, it is preferable that all of the blended components be dissolved, and it is preferable that the components which are not dissolved be evenly dispersed.

The temperature at the time of being blended with the reducing agent is not particularly limited unless each of the blended components is degraded, and is preferably −5° C. to 60° C. In addition, the blending time may be suitably adjusted depending on the type of the blended component or the temperature at the time of being blended therewith, and for example, is preferably 0.5 hours to 12 hours.

As described above, the other component may be blended therewith at the time of manufacturing either the first mixture or the second mixture, or may be blended therewith at the time of manufacturing both of the first mixture and the second mixture. That is, while manufacturing the silver ink composition through the first mixture and the second mixture, a ratio of the blended amount of the other component to the total amount of the blended components other than the carbon dioxide ([Other Components (mass)]/[Forming Material of Metal Silver, Nitrogen-Containing Compound, Reducing Agent, Alcohol, and Other Components (mass)]× 100) is preferably less than or equal to 10 mass %, is more preferably less than or equal to 5 mass %, and even when 0 mass of the other component is blended therewith, that is, the component is not blended therewith, the silver ink composition is able to sufficiently express the effect.

For example, when the reducing agent is blended therewith, the obtained blended substance (the silver ink composition) relatively easily emits heat. Then, when the temperature at the time of blending the reducing agent therewith is high, the blended substance is in the same state as that at the time of performing the heat treatment with respect to the silver ink composition described below, and thus it is assumed that the metal silver starts to be formed in at least a part of the silver carboxylate according to decomposition stimulatory action of the silver carboxylate due to the reducing agent. When the silver layer is formed, the silver ink composition containing such metal silver is subjected to a post-treatment in more moderate conditions than that of the silver ink composition not containing the metal silver, and thus the silver layer is able to be formed. In addition, even when the blended amount of the reducing agent is sufficient, the post-treatment is also performed in the moderate conditions, and thus the silver layer is able to be formed. Thus, by adopting conditions for stimulating the decomposition of the silver carboxylate, it is possible to form the silver layer by performing a heat treatment at a lower temperature or by performing only a drying treatment at the normal temperature without performing the heat treatment as the post-treatment. In addition, it is possible to handle the silver ink composition containing such metal silver as with the silver ink composition not containing the metal silver, and in particular, the handleability is also not degraded.

In the present invention, it is preferable that the reducing agent be blended therewith while being dripped, and the surface roughness of the silver layer tends to be further reduced by limiting fluctuation in the drip rate.

In the silver ink composition formed by supplying the carbon dioxide thereto, for example, the viscosity of the silver ink composition at 20° C. to 25° C. is preferably greater than or equal to 1 Pa·s when the silver ink composition is applied to a printing method using high viscosity ink such as a screen printing method, and a flexo printing method.

The silver ink composition, for example, is able to be attached onto the substrate by using a known method such as a printing method, a coating method, and a dipping method.

As the printing method, a screen printing method, a flexo printing method, an offset printing method, a dip type printing method, an ink jet type printing method, a dispenser type printing method, a gravure printing method, a gravure offset printing method, a pad printing method, and the like are exemplary examples.

As the coating method, a method using various coaters such as a spin coater, an air knife coater, a curtain coater, a die coater, a blade coater, a roll coater, a gate roll coater, a bar coater, a rod coater, and a gravure coater, a wire bar, or the like is an exemplary example.

In the step of forming the silver layer, the amount of the silver ink composition to be attached onto the substrate 11 or the blended amount of the forming material of the metal silver in the silver ink composition is adjusted, and thus the thickness of the silver layer 12 is able to be adjusted.

When the silver ink composition attached onto the substrate 11 is subjected to the drying treatment, the drying treatment may be performed by using a known method, and for example, may be performed under any one of ordinary pressure, reduced pressure, and air blasting conditions, or may be performed under either the atmosphere or the inert gas atmosphere. Then, the dry temperature is also not particularly limited, and the drying treatment may be either drying by heating or normal temperature drying. As a preferred drying method at the time that the heat treatment is not necessary, a method of performing drying at 18° C. to 30° C. under the atmosphere is an exemplary example.

When the silver ink composition attached onto the substrate 11 is subjected to the heating (baking) treatment, the conditions may be suitably adjusted depending on the type of the blended component of the silver ink composition. In general, the heating temperature is preferably 60° C. to 200° C., and is more preferably 70° C. to 180° C. The heating time may be adjusted depending on the heating temperature, and in general, is preferably 0.2 hours to 12 hours, and is more preferably 0.4 hours to 10 hours. In the silver carboxylate, Silver β-Ketocarboxylate (1), for example, is different from the forming material of the metal silver such as the silver oxide, and is decomposed at a low temperature even when the reducing agent or the like which is known in the field is not used. Then, in a reflection of such a decomposition temperature, the silver ink composition is able to form the metal silver at an extremely lower temperature than that in the related art, as described above.

A method of performing the heat treatment with respect to the silver ink composition is not particularly limited, and for example, the heat treatment is able to be performed by heating of an electrical furnace, heating of a thermosensitive heating head, heating of far-infrared ray irradiation, and the like. In addition, the heat treatment of the silver ink composition may be performed under the atmosphere, or may be performed under the inert gas atmosphere. Then, the heat treatment of the silver ink composition may be performed under either ordinary pressure or reduced pressure.

The silver layer 12 at the time of using the silver ink composition is a layer formed of a conductive body which is formed by performing the post-treatment with respect to the silver ink composition, and includes the metal silver as a main component.

When the laminate according to the present invention includes the adhesion layer between the substrate and the silver layer (for example, the laminate 2 shown in FIG. 2), the laminate, for example, is able to be manufactured by a manufacturing method including a step of forming the adhesion layer on the substrate, and a step of forming the silver layer on the adhesion layer.

[Step of Forming Adhesion Layer on Substrate]

The adhesion layer, for example, is able to be formed by preparing a composition for forming the adhesion layer (hereinafter, referred to as a "composition for an adhesion layer"), by attaching the composition onto the substrate, and as necessary, by performing the post-treatment.

The material forming the adhesion layer in the composition for an adhesion layer (hereinafter, referred to as an "adhesion layer forming material") may be one material, or may be two or more materials, and when two or more materials are used, the compounds combined and the ratio of each compound relative to the others can be arbitrarily adjusted.

When the adhesion layer forming material is a forming material of a resin (a monomer or a base resin), as described above, it is preferable that the adhesion layer forming material be an urethane acrylate resin, and it is more preferable that the adhesion layer forming material be a polycarbonate skeleton-containing urethane acrylate resin.

When the adhesion layer forming material is the forming material of the resin, it is preferable that the composition for an adhesion layer be a composition in which the forming material of the resin, an initiator (a polymerization initiator), and a solvent are blended with each other.

The initiator may be suitably selected from known initiators depending on the type of the forming material of the resin, and is not particularly limited.

The solvent may be suitably selected from known solvents such as cyclohexanone, 1,2-dimethoxy ethane (dimethyl sellosolve), and propylene glycol monomethyl ether acetate, unless a polymerization reaction is inhibited. One of the solvents may be independently used, or two or more thereof may be used in combination, when two or more of the solvents are used in combination, the compounds combined and the ratio of each compound relative to the others can be arbitrarily adjusted.

When the adhesion layer forming material is a silane coupling agent, as described above, it is preferable that the adhesion layer forming material be Compound (3).

When the adhesion layer forming material is the silane coupling agent, it is preferable that the composition for an adhesion layer be a composition in which the silane coupling agent and a solvent are blended with each other.

The solvent is not particularly limited unless the silane coupling agent is considerably degraded, and as a preferred example thereof, alcohol having carbon atoms of greater than or equal to 2 such as ethanol, and 2-propanol (isopropyl alcohol) is an exemplary example. One of the solvents may be independently used, or two or more thereof may be used in combination, when two or more of the solvents are used in combination, the compounds combined and the ratio of each compound relative to the others can be arbitrarily adjusted.

The composition for an adhesion layer is obtained by blending the forming material of the resin therewith, and as necessary, components other than the forming material of the resin (when the forming material of the resin is used as the adhesion layer forming material, the initiator, the solvent, and the like).

The blended method and the blended conditions of each of the components are identical to those in the silver ink composition except that the blended component is different.

For example, when a composition in which the forming material of the resin, the initiator, and the solvent are blended with each other is used as the composition for an adhesion layer, the ratio of the blended amount of the forming material of the resin to the total amount of the blended components is preferably 25 mass % to 75 mass %, and is more preferably 35 mass % to 65 mass %.

In addition, in the composition for an adhesion layer, the blended amount of the initiator is preferably 0.01 mass times to 0.1 mass times, and is more preferably 0.02 mass times to 0.08 mass times, with respect to the blended amount of the forming material of the resin.

In addition, in the composition for an adhesion layer, the blended amount of the solvent is preferably 0.1 mass times to 3 mass times, and is more preferably 0.5 mass times to 1.5 mass times, with respect to the blended amount of the forming material of the resin.

On the other hand, when a composition in which the silane coupling agent and the solvent are blended with each other is used as the composition for an adhesion layer, a ratio of the blended amount of the silane coupling agent to the total amount of the blended components is preferably 1 mass % to 50 mass %, and is more preferably 3 mass % to 30 mass %. By setting the ratio to be greater than or equal to the lower limit value, it is possible to more efficiently form the adhesion layer, and by setting the ratio to be less than or equal to the upper limit value, the handleability of the composition for an adhesion layer is further improved.

The composition for an adhesion layer using the forming material of the resin may be a composition obtained by blending other components including the forming material of the resin, the initiator, and the solvent, with each other.

Similarly, the composition for an adhesion layer using the silane coupling agent may be a composition in which other components are blended in addition to the silane coupling agent and the solvent.

Even when either the forming material of the resin or the silane coupling agent is used, the other component in the composition for an adhesion layer is able to be arbitrarily selected depending on the purpose, and is not particularly limited. Then, one of the other components may be independently used, or two or more thereof may be used in combination, when two or more of the other components are used in combination, the compounds combined and the ratio of each compound relative to the others can be arbitrarily adjusted.

Even when either the forming material of the resin or the silane coupling agent is used, in the composition for an adhesion layer, a ratio of the blended amount of the other component to the total amount of the blended components is preferably less than or equal to 10 mass %, and is more preferably less than or equal to 5 mass %.

The composition for an adhesion layer is able to be attached to a desired portion on the substrate 11 by using the same method as that in the silver ink composition.

In the step of forming the adhesion layer on the substrate described above, the thickness of the adhesion layer 13 is able to be adjusted by adjusting the amount of the composition for an adhesion layer to be attached to the desired portion on the substrate 11 or the blended amount of the adhesion layer forming material in the composition for an adhesion layer.

The post-treatment at the time of forming the adhesion layer may be suitably selected depending on the type of the composition for an adhesion layer. For example, when the adhesion layer forming material is the forming material of the resin, an ultraviolet ray irradiation treatment or a heat treatment may be performed, and when the adhesion layer forming material is the silane coupling agent, a heat treatment may be performed.

[Step of Forming Silver Layer on Adhesion Layer]

After the step of forming the adhesion layer on the substrate, for example, the silver layer is able to be formed on the adhesion layer by the same method as that in the step of forming the silver layer on the substrate described with reference to FIG. 3A and FIG. 3B except that a substrate on which an adhesion layer is formed is used instead of a substrate on which an adhesion layer is not formed, such as the substrate 11 shown in FIG. 3A and FIG. 3B.

«Circuit Board»

The circuit board according to the present invention is a circuit board in which the electronic component is mounted on the surface in which the Kurtosis of the roughness curve satisfies at least one of Conditions (i) and (ii) described above in the silver layer of the laminate through the conductive joint portion, and the silver layer of the laminate is the wiring portion.

The circuit board is able to be configured by using the same laminate as that in the related art except that the laminate includes a layer in which the Kurtosis of the roughness curve of the surface satisfies at least one of Conditions (i) and (ii) described above as the silver layer.

For example, as the conductive joint portion, a portion formed by curing a conductive adhesive agent, a portion configured of solder, and the like are exemplary examples, and the portion formed by curing the conductive adhesive agent is preferable. As the conductive adhesive agent, a known conductive adhesive agent such as an ultraviolet curable conductive adhesive agent is able to be suitably used.

In addition, the electronic component is able to be arbitrary selected depending on the usage of the circuit board.

The circuit board is able to maintain a high joining force between the silver layer and the electronic component under high temperature and high humidity conditions by using the laminate. This is because an interface fracture is suppressed on at least an interface between the joining layer (the conductive joint portion) and the silver layer, preferably on both of an interface between the joining layer (the conductive joint portion) and the silver layer and an interface between the joining layer (the conductive joint portion) and the electronic component under high temperature and high humidity conditions.

For example, when a test of placing the silver layer for 480 hours under conditions of a temperature of 85° C. and a relative humidity of 85% is performed, a change rate of the joining force between the silver layer and the electronic component is preferably greater than or equal to −50%, and is more preferably greater than or equal to −20%. This indicates that the change rate preferably satisfies a relationship of Expression (iii)-1 described below, and is more preferably satisfies a relationship of Expression (iii)-2 described below.

$$(F_{480}-F_0)/F_0\times100\geq-50 \tag{iii-1}$$

$$(F_{480}-F_0)/F_0\times100\geq-20 \tag{iii-2}$$

(in the expression, $F_0$ represents the joining force between the silver layer and the electronic component before being tested; and $F_{480}$ represents the joining force between the silver layer and the electronic component after being tested (after 480 hours have elapsed))

Here, as the "joining force", for example, a shearing force at the time of detaching mounted parts which is observed when a lateral shear strength test is performed with respect to surface mounting parts on the basis of JEITA ET-7409-102 is able to be adopted.

In the circuit board, the electronic component is able to be stably mounted under high temperature and high humidity conditions, and thus it is possible to maintain stable performance over a long period of time.

EXAMPLES

Hereinafter, the present invention will be described in detail with reference to a specific example. However, the present invention is not limited to the following examples.

Example 1

<Manufacturing of Laminate and Circuit Board>
(Manufacturing of Silver Ink Composition)

Silver 2-methylacetoacetate was added to 2-ethylhexylamine (a molar amount of 1 time with respect to silver 2-methylacetoacetate described below) such that a liquid temperature was lower than or equal to 50° C., and was stirred for 15 minutes, and thus a liquid substance was obtained. A formic acid (a molar amount of 0.8 times with respect to silver 2-methylacetoacetate) was dripped into the liquid substance for 30 minutes such that the temperature of the reaction liquid was lower than or equal to 50° C. After dripping the formic acid, the reaction liquid was further stirred at 25° C. for 1.5 hours, and thus Silver Ink Composition (I-1) was obtained. The blending ratio of each of the components is shown in Table 1. In Table 1, "Nitrogen-Containing Compound (molar ratio)" indicates the blended amount of the nitrogen-containing compound per 1 mol of the blended amount of the silver carboxylate (Number of Moles) ([Number of Moles of Nitrogen-Containing Compound]/[Number of Moles of Silver Carboxylate]). Similarly, "Reducing Agent (molar ratio)" also indicates the blended amount of the reducing agent per 1 mol of the blended amount of the silver carboxylate (Number of Moles) ([Number of Moles of Reducing Agent]/[Number of Moles of Silver Carboxylate]).

(Manufacturing of Composition for Adhesion Layer)

An ultraviolet curable polycarbonate skeleton-containing urethane acrylate resin ("UV3310B", manufactured by The Nippon Synthetic Chemical Industry Co., Ltd., viscosity: 40000 to 70000 (60° C.) (mPa·s), the number of functional groups: 2, weight-average molecular weight: 5000, a preferred UV irradiance level: 800 (mJ/cm$^2$)), cyclohexanone (manufactured by Wako Pure Chemical Industries, Ltd.), and a photo initiator ("Irgacure 127", manufactured by BASF Corporation) were added so as to have the blended amounts shown in Table 2, and were stirred at room temperature (25° C.) for 10 minutes, and thus a composition for an adhesion layer was prepared. Furthermore, in Table 2, the blended amount shown in the unit of mass % indicates the ratio of each of the blended components to the total amount of the blended components.

(Manufacturing of Laminate)

The obtained composition for an adhesion layer was applied onto one principal surface (a surface) of a substrate (a thickness of 2 mm) formed of a polycarbonate (PC)/an ABS resin alloy by using a bar coater (#01) and was dried in an oven at 80° C. for 5 minutes, and then the coated film which was dried by using an ozoneless high pressure mercury lamp was irradiated with an ultraviolet ray having a dose of 100 mJ/cm$^2$, and thus an adhesion layer (a thickness of 3 μm to 4 μm) was formed on the substrate surface.

Next, the obtained silver ink composition was applied onto the adhesion layer by using a screen printing method, and then the silver ink composition was subjected to a heating (baking) treatment in the oven at 80° C. for 2 hours, and thus a silver layer (a thickness of 1 μm) was formed on the surface of the adhesion layer as a conductive layer, and a laminate was obtained.

(Manufacturing of Circuit Board)

Figure 4A:
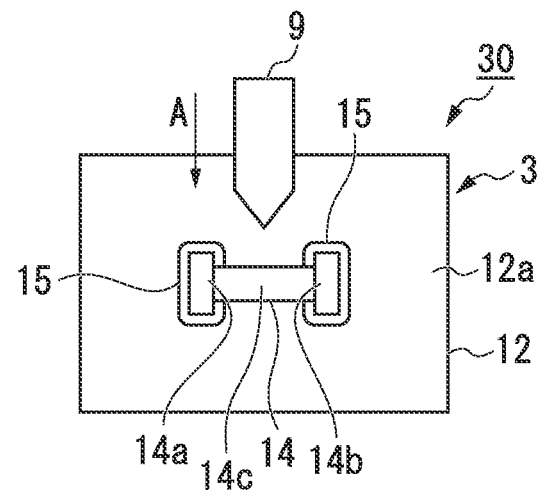
FIG. 4A is a schematic view for showing a circuit board according to the present invention, and a lateral shear strength test of the example.
Figure 4B:
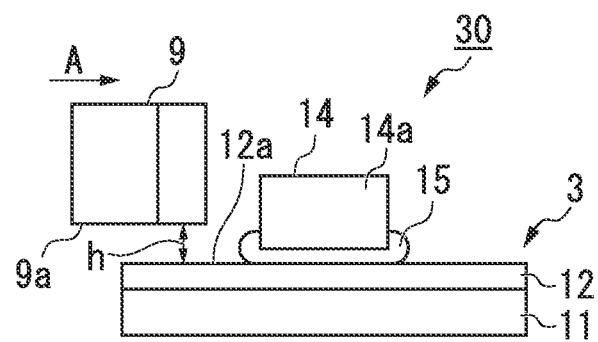
FIG. 4B is a schematic view for showing the circuit board according to the present invention, and the lateral shear strength test of the example.

According to the following procedures, a circuit board having a structure shown in FIG. 4A and FIG. 4B was manufactured.

That is, 0.07 mg of a conductive adhesive agent ("QMI516IE", manufactured by Henkel Japan Ltd.) was applied to a predetermined portion of the silver layer surface of the laminate, terminal portions of 1608 chips having 0Ω (terminal portion surfaces of both ends were plated with gold) as an electronic component were in contact with the conductive adhesive agent, and the chip was fixed by curing the conductive adhesive agent in standard curing conditions thereof, and thus a circuit board was obtained in which the chip was mounted on the silver layer of the laminate through a joining layer formed of a conductive adhesive agent. A plurality of circuit boards were manufactured, and were subjected to the following evaluation. Furthermore, the properties of the used conductive adhesive agent are shown in Table 3.

<Evaluation of Circuit Board>
(Calculation of Change Rate of Kurtosis)

The obtained circuit board was placed and retained under conditions of a temperature of 85° C. and a relative humidity of 85%, and Kurtosis (Rku) of a roughness curve of the silver layer surface of each of the circuit boards was calculated after 240 hours, 480 hours, and 720 hours had elapsed from before starting retention and after the retention, and a change rate of the Kurtosis after the retention of the circuit board for a predetermined period of time with respect to the Kurtosis before starting the retention of the circuit board was calculated. The results thereof are shown in Table 4. Furthermore, the Kurtosis of the roughness curve was calculated by the following method. That is, the shape of an exposed surface of the surface of the silver layer on which the joining layer was not formed was measured from an upper portion of the exposed surface by using a shape measurement laser microscope ("VK-X100", manufactured by Keyence Corporation) (a measurement mode: a surface shape, a measurement size: 2048×1536, and measurement quality: high accuracy), the inclination of the substrate was corrected, and then a high-pass filter (a cutoff value $\lambda_C$: 0.08 mm) was applied to the obtained sectional surface curve, and thus the roughness curve was obtained. Then, the Kurtosis (Rku) of the roughness curve was calculated from the profile of the obtained roughness curve within a measurement range of 50 μm×50 μm.

(Evaluation of Joining Force)

According to the following procedures, as shown in FIG. 4A and FIG. 4B, the lateral shear strength test was performed on the basis of JEITA ET-7409-102. FIG. 4A is a plan view for schematically showing the circuit board according to the present invention which is used in the test, and the lateral shear strength test thereof, and FIG. 4B is a side view thereof.

That is, a tip end portion of a pressing jig 9 was brought into contact with a side surface of a main body 14c between terminal portions 14a and 14b of both ends in a chip 14 (the chip) of the circuit board 30 by using a circuit board 30 before starting the retention and after being retained for a predetermined period of time. At this time, the height (a shear height) h of a lower surface 9a of the pressing jig 9 from the surface 12a of the silver layer 12 was set to 0.1 mm. Then, the pressing jig 9 was pressed in a direction (a direction of an arrow A) which is parallel with the surface of the silver layer 12 and is perpendicular to a longitudinal direction of a main body portion 14c of the chip 14 (a direction connecting the terminal portions 14a and 14b) at a shear rate of 0.5 mm/minute, and thus a shearing force was applied to the chip 14, and a shearing force (N) at the time of detaching the chip 14 from the laminate 3 was set to a joining force. The results thereof are shown in Table 4. Furthermore, in FIG. 4A and FIG. 4B, a reference numeral "15" is a joining (adhering) layer which is formed by curing a conductive adhesive agent, and corresponds to the conductive joint portion described above.

Examples 2 to 4 and Comparative Examples 1 and 2

<Manufacturing of Laminate and Circuit Board, and Evaluation of Circuit Board>

As shown in Table 4, a laminate and a circuit board were manufactured by the same method as that in Example 1 except that at least one of the laminate and the chip was changed, and the circuit board was evaluated. The results thereof are shown in Table 4.

Furthermore, "Silver Ink Composition (I-2)" in Table 4 indicates a silver ink composition which is manufactured by the same method as that of Silver Ink Composition (I-1) in Example 1 except that the blended component and the blended amount are changed as shown in Table 1.

In addition, a chip used in Examples 3 and 4 is a chip in which terminal portion surfaces of both ends are plated with tin instead of gold in the chip used in Examples 1 and 2.

In addition, a laminate for comparing used in Comparative Examples 1 and 2 is a laminate in which a silver plating layer having a thickness of 1 μm is formed on a surface of a substrate of SUS304 having a thickness of 100 μm.

Examples 5 to 8 and Comparative Examples 3 and 4

<Manufacturing of Laminate and Circuit Board, and Evaluation of Circuit Board>

A laminate and a circuit board were manufactured by the same method as that in Examples 1 to 4 and Comparative Examples 1 to 2 except that "CA-110" manufactured by Ajinomoto General Foods, Inc. which is shown in Table 3 was used instead of "QMI516IE" manufactured by Henkel Japan Ltd. as the conductive adhesive agent, and the circuit board was evaluated. The results thereof are shown in Table 5.

Furthermore, in Table 5, a laminate for comparing used in Comparative Examples 3 and 4 is identical to the laminate for comparing used in Comparative Examples 1 and 2.

Examples 9 to 12 and Comparative Examples 5 and 6

<Manufacturing of Laminate and Circuit Board, and Evaluation of Circuit Board>

A laminate and a circuit board were manufactured by the same method as that in Examples 1 to 4 and Comparative Examples 1 and 2 except that "CA-100" manufactured by Ajinomoto General Foods, Inc. which is shown in Table 3 was used instead of "QMI516IE" manufactured by Henkel Japan Ltd. as the conductive adhesive agent, and the circuit board was evaluated. The results thereof are shown in Table 6.

Furthermore, in Table 6, a laminate for comparing used in Comparative Examples 5 and 6 is identical to the laminate for comparing used in Comparative Examples 1 and 2.

TABLE 1

| | | Silver Ink Composition | | |
| --- | --- | --- | --- | --- |
| | | Blended Component | | |
| | Type | Silver Carboxylate | Nitrogen-Containing Compound (Molar Ratio) | Reducing Agent (Molar Ratio) |
| Example 1 | I-1 | Silver 2-Methylacetoacetate | 2-Ethylhexyl-amine (1.0) | Formic Acid (0.80) |
| Example 2 | I-2 | Silver 2-Methylacetoacetate | 2-Ethylhexyl-amine (0.4) | Formic Acid (0.80) |

TABLE 2

| | Blended Component of Composition for Adhesion Layer (Mass %) | | |
| --- | --- | --- | --- |
| | Base Resin | Solvent | Initiator |
| Examples 1 and 2 | Urethane Acrylate Resin Having Polycarbonate Skeleton (48.8) | Cyclohexanone (48.8) | Irgacure 127 (2.4) |

TABLE 3

| Conductive Adhesive Agnet | Properties |
| --- | --- |
| QMI516IE | Base Resin: Bismaleimide Resin<br>Conductive Filler Content: 81 Mass %<br>Specific Resistivity: $1 \times 10^{-3}$ Ω · cm<br>Tg: 43° C.<br>Standard Curing Conditions: 80° C., 80 Minutes |
| CA-110 | Base Resin: Epoxy Resin<br>Conductive Filler Content: 80 Mass %<br>Specific Resistivity: $2.6 \times 10^{-4}$ Ω · cm<br>Tg: 83° C.<br>Standard Curing Conditions: 80° C., 60 Minutes |
| CA-100 | Base Resin: Epoxy Resin<br>Conductive Filler Content: 80 Mass %<br>Specific Resistivity: $5.3 \times 10^{-4}$ Ω · cm<br>Tg: 90° C.<br>Standard Curing Conditions: 80° C., 60 Minutes |

TABLE 4

| | | | <Conductive Adhesive Agent: QMI516IE> | | | | |
| --- | --- | --- | --- | --- | --- | --- | --- |
| | Laminate | Chip | | Evaluation Result | | | |
| | Silver Layer | Plating of | | Joining Force | | Kurtosis | |
| | Forming Material | Terminal Portion | Time | Measured Value (N) | Change Rate (%) | Calculated Value | Change Rate (%) |
| Example 1 | Silver Ink Composition (I-1) | Gold | 0 | 5.2 | 0 | 4.1 | 0 |
| | | | 240 | 12.8 | 146 | 7.8 | 90 |
| | | | 480 | 9.8 | 88 | 20.9 | 410 |
| | | | 720 | 13.5 | 160 | 58.5 | 1327 |

TABLE 4-continued

| | | | | <Conductive Adhesive Agent: QMI516IE> | | | | |
|---|---|---|---|---|---|---|---|---|
| | Laminate | Chip | | Evaluation Result | | | | |
| | Silver Layer | Plating of | | Joining Force | | Kurtosis | | |
| | Forming Material | Terminal Portion | Time | Measured Value (N) | Change Rate (%) | Calculated Value | Change Rate (%) | |
| Example 2 | Silver Ink Composition (I-2) | Gold | 0 | 5.2 | 0 | 4.8 | 0 | |
| | | | 240 | 15.3 | 194 | 7.6 | 58 | |
| | | | 480 | 13.2 | 154 | 19.1 | 298 | |
| | | | 720 | 16.6 | 219 | 25.8 | 438 | |
| Comparative Example 1 | Plating | Gold | 0 | 9.1 | 0 | 3.6 | 0 | |
| | | | 240 | 4.8 | −47 | 3.7 | 3 | |
| | | | 480 | 1.3 | −86 | 4.8 | 33 | |
| | | | 720 | 1.5 | −84 | 5.9 | 64 | |
| Example 3 | Silver Ink Composition (I-1) | Tin | 0 | 7.8 | 0 | 4.1 | 0 | |
| | | | 240 | 12.0 | 54 | 7.8 | 90 | |
| | | | 480 | 9.2 | 18 | 20.9 | 410 | |
| | | | 720 | 9.2 | 18 | 58.5 | 1327 | |
| Example 4 | Silver Ink Composition (I-2) | Tin | 0 | 5.9 | 0 | 4.8 | 0 | |
| | | | 240 | 12.9 | 119 | 7.6 | 58 | |
| | | | 480 | 12.8 | 117 | 19.1 | 298 | |
| | | | 720 | 15.5 | 163 | 25.8 | 438 | |
| Comparative Example 2 | Plating | Tin | 0 | 8.2 | 0 | 3.6 | 0 | |
| | | | 240 | 4.8 | −41 | 3.7 | 3 | |
| | | | 480 | 2.3 | −72 | 4.8 | 33 | |
| | | | 720 | 0.8 | −90 | 5.9 | 64 | |

TABLE 5

| | | | | <Conductive Adhesive Agent: CA-110> | | | | |
|---|---|---|---|---|---|---|---|---|
| | Laminate | Chip | | Evaluation Result | | | | |
| | Silver Layer | Plating of | | Joining Force | | Kurtosis | | |
| | Forming Material | Terminal Portion | Time | Measured Value (N) | Change Rate (%) | Calculated Value | Change Rate (%) | |
| Example 5 | Silver Ink Composition (I-1) | Gold | 0 | 9.1 | 0 | 4.1 | 0 | |
| | | | 240 | 8.8 | −3 | 7.8 | 90 | |
| | | | 480 | 7.5 | −18 | 20.9 | 410 | |
| | | | 720 | 7.3 | −20 | 58.5 | 1327 | |
| Example 6 | Silver Ink Composition (I-2) | Gold | 0 | 7.8 | 0 | 4.8 | 0 | |
| | | | 240 | 7.8 | 0 | 7.6 | 58 | |
| | | | 480 | 6.6 | −15 | 19.1 | 298 | |
| | | | 720 | 7.6 | −3 | 25.8 | 438 | |
| Comparative Example 3 | Plating | Gold | 0 | 7.9 | 0 | 3.6 | 0 | |
| | | | 240 | 5.3 | −33 | 3.7 | 3 | |
| | | | 480 | 3.4 | −57 | 4.8 | 33 | |
| | | | 720 | 2.6 | −67 | 5.9 | 64 | |
| Example 7 | Silver Ink Composition (I-1) | Tin | 0 | 8.2 | 0 | 4.1 | 0 | |
| | | | 240 | 6.1 | −26 | 7.8 | 90 | |
| | | | 480 | 6.9 | −16 | 20.9 | 410 | |
| | | | 720 | 7.5 | −9 | 58.5 | 1327 | |
| Example 8 | Silver Ink Composition (I-2) | Tin | 0 | 9.3 | 0 | 4.8 | 0 | |
| | | | 240 | 9.1 | −2 | 7.6 | 58 | |
| | | | 480 | 9.3 | 0 | 19.1 | 298 | |
| | | | 720 | 6.8 | −27 | 25.8 | 438 | |
| Comparative Example 4 | Plating | Tin | 0 | 10.0 | 0 | 3.6 | 0 | |
| | | | 240 | 4.4 | −56 | 3.7 | 3 | |
| | | | 480 | 2.7 | −73 | 4.8 | 33 | |
| | | | 720 | 2.6 | −74 | 5.9 | 64 | |

TABLE 6

<Conductive Adhesive Agent: CA-100>

| | Laminate Silver Layer Forming Material | Chip Plating of Terminal Portion | Time | Joining Force Measured Value (N) | Joining Force Change Rate (%) | Kurtosis Calculated Value | Kurtosis Change Rate (%) |
|---|---|---|---|---|---|---|---|
| Example 9 | Silver Ink Composition (I-1) | Gold | 0 | 2.5 | 0 | 4.1 | 0 |
| | | | 240 | 3.9 | 56 | 7.8 | 90 |
| | | | 480 | 3.3 | 32 | 20.9 | 410 |
| | | | 720 | 3.4 | 36 | 58.5 | 1327 |
| Example 10 | Silver Ink Composition (I-2) | Gold | 0 | — | — | 4.8 | 0 |
| | | | 240 | — | — | 7.6 | 58 |
| | | | 480 | — | — | 19.1 | 298 |
| | | | 720 | — | — | 25.8 | 438 |
| Comparative Example 5 | Plating | Gold | 0 | 4.3 | 0 | 3.6 | 0 |
| | | | 240 | 0.7 | −84 | 3.7 | 3 |
| | | | 480 | 0.5 | −88 | 4.8 | 33 |
| | | | 720 | 0.4 | −91 | 5.9 | 64 |
| Example 11 | Silver Ink Composition (I-1) | Tin | 0 | 1.8 | 0 | 4.1 | 0 |
| | | | 240 | 2.5 | 39 | 7.8 | 90 |
| | | | 480 | 3.4 | 89 | 20.9 | 410 |
| | | | 720 | 3.6 | 100 | 58.5 | 1327 |
| Example 12 | Silver Ink Composition (I-2) | Tin | 0 | — | — | 4.8 | 0 |
| | | | 240 | — | — | 7.6 | 58 |
| | | | 480 | — | — | 19.1 | 298 |
| | | | 720 | — | — | 25.8 | 438 |
| Comparative Example 6 | Plating | Tin | 0 | 4.0 | 0 | 3.6 | 0 |
| | | | 240 | 0.3 | −93 | 3.7 | 3 |
| | | | 480 | 0.1 | −98 | 4.8 | 33 |
| | | | 720 | 0.1 | −98 | 5.9 | 64 |

As it is obvious from the results described above, in the laminate of Examples 1 to 9 and 11, the Kurtosis of the roughness curve of the silver layer surface satisfied both Conditions (i) and (ii), and thus even when the laminate was retained for a long period of time under high temperature and high humidity conditions, a high joining (adhering) force between the silver layer and the electronic component was maintained. In these examples, a peeling portion of the chip was observed in the circuit board after measuring the shearing force (the joining force), and in any example, it was confirmed that the chip peeled off due to a cohesion failure of the joining (adhering) layer which was formed by curing the conductive adhesive agent regardless of before starting the retention or after the retention. That is, in the circuit board, an interface fracture did not occur in either the interface between the joining layer and the silver layer or the interface between the joining layer and the electronic component.

In contrast, in the laminate of Comparative Examples 1 to 6, the Kurtosis of the roughness curve of the silver layer surface did not satisfy both Conditions (i) and (ii), and thus when the laminate was retained under high temperature and high humidity conditions, the joining force between the silver layer and the electronic component was decreased. As with the examples described above, the peeling portion of the chip was observed in the circuit board after measuring the shearing force (the joining force), and in any comparative example, it was confirmed that the chip peeled off due to the cohesion failure of the joining (adhering) layer before starting the retention as with the examples described above, but the chip peeled off due to the interface fracture in the interface between the joining layer and the silver layer after the retention. However, even after the retention, the interface fracture did not occur in the interface between the joining layer and the electronic component.

Furthermore, when a change rate of the surface roughness (arithmetic average roughness (Ra)) was calculated instead of the change rate of the Kurtosis (Rku) of the roughness curve of the silver layer surface, an obvious difference was not confirmed in the examples and the comparative examples described above.

The calculated value and the change rate of the Kurtosis of the roughness curve shown in the results described above were obtained from the exposed surface of the silver layer surface on which the joining layer was not formed, and the calculated value and the change rate of the Kurtosis of a surface (the interface with respect to the joining layer) on which the joining layer was formed were confirmed, and as a result thereof, the calculated value and the change rate of the Kurtosis of the surface on which the joining layer was formed were the same values as those of the exposed surface, and indicated the same tendency with respect to the Kurtosis of the roughness curve regardless of the exposure of the silver layer surface.

As described above, it was confirmed that the change rate of the Kurtosis of the roughness curve of the silver layer surface affected the joining force between the silver layer and the conductive joint portion.

Then, according to the present invention, it was confirmed that the silver layer was able to maintain a high joining force with respect to the electronic component under high temperature and high humidity conditions regardless of the type of the joining layer (the conductive joint portion) and the type of the plating (the joint portion of the electronic component) of the terminal portion surface of the chip.

Example 13

<Manufacturing of Laminate and Circuit Board, and Evaluation of Circuit Board>

(Manufacturing of Silver Ink Composition)

Silver 2-methylacetoacetate, 2-ethylhexylamine (a molar amount of 2.25 times with respect to silver 2-methylacetoacetate), and 3,5-dimethyl-1-hexyne-3-ol ("Surfynol 61", manufactured by Air Products and Chemicals, Inc.) (a molar amount of 0.1 times with respect to silver 2-methylacetoacetate) were blended, and were stirred at room temperature (25° C.) for 60 minutes, and thus Silver Ink Composition (I-3) was obtained. A blending ratio of each of the components is shown in Table 7. In Table 7, "Nitrogen-Containing Compound (molar ratio)" indicates the blended amount of the nitrogen-containing compound per 1 mol of the blended amount of the silver carboxylate (Number of Moles) ([Number of Moles of Nitrogen-Containing Compound]/[Number of Moles of Silver Carboxylate]). Similarly, "Alcohol (molar ratio)" also indicates the blended amount of the alcohol per 1 mol of the blended amount of the silver carboxylate (Number of Moles) ([Number of Moles of Alcohol]/[Number of Moles of Silver Carboxylate]).

(Manufacturing of Composition for Adhesion Layer)

As Compound (3), N-2-(aminoethyl)-3-aminopropyltrimethoxysilane $((CH_3O)_3Si(CH_2)_3NH(CH_2)_2NH_2$, "KBM603", manufactured by Shin-Etsu Chemical Co., Ltd.) and 2-propanol were blended such that each ratio of the blended amount to the total amount of the blended component was 20 mass % and 80 mass %, and were stirred at room temperature (25° C.) for 60 minutes, and thus a composition for an adhesion layer was obtained.

(Manufacturing of Laminate and Circuit Board, and Evaluation of Circuit Board)

The obtained composition for an adhesion layer was applied onto a substrate (a thickness of 0.25 mm) of polyethylene naphthalate (PEN) by using an applicator, and was subjected to a heat treatment at 120° C. for 10 minutes by using an oven, and thus an adhesion layer (a thickness of 0.5 μm to 1 μm) was formed on the substrate.

Subsequently, a silver layer (a thickness of 1 μm) was formed on the surface of the adhesion layer by using the same method as that in Example 1, and thus a laminate and a circuit board were manufactured, and the circuit board was evaluated. The results thereof are shown in Table 8.

Example 14

<Manufacturing of Laminate and Circuit Board, and Evaluation of Circuit Board>

An adhesion layer (a thickness of 0.5 μm to 1 μm) was formed on a substrate (a thickness of 0.25 mm) of polyethylene naphthalate by using the same method as that in Example 13.

Next, Silver Ink Composition (II-1) ("TEC-IJ-010", manufactured by Inktec Corporation, a silver concentration of 15 mass %) which was formed by being blended with a silver complex was applied onto the adhesion layer by using a screen printing method, and then was subjected to a heating (baking) treatment at 150° C. for 1 hours in the oven, and thus a silver layer (a thickness of 1 μm) was formed on the surface of the adhesion layer as a conductive layer, and a laminate was obtained.

Next, a circuit board was manufactured and evaluated by using the same method as that in Example 1 using this laminate. The results thereof are shown in Table 8.

Comparative Example 7

<Manufacturing of Laminate and Circuit Board, and Evaluation of Circuit Board>

An adhesion layer (a thickness of 3 μm to 4 μm) was formed on a surface of a substrate (a thickness of 2 mm) formed of a polycarbonate/an ABS resin alloy by using the same method as that in Example 1.

Next, Silver Ink Composition (II-2) ("TEC-PA-010", manufactured by Inktec Corporation, a silver concentration of 55 mass %, and non-use of a binder) which was formed by being blended with a silver complex and silver particles was applied onto the adhesion layer by using a screen printing method, and then was subjected to a heating (baking) treatment at 80° C. for 2 hours in an oven, and thus a silver layer (a thickness of 1 μm) was formed on the surface of the adhesion layer as a conductive layer, and a laminate was obtained.

Next, a circuit board was manufactured and evaluated by using the same method as that in Example 1 using this laminate. The results thereof are shown in Table 8.

Comparative Example 8

<Manufacturing of Laminate and Circuit Board, and Evaluation of Circuit Board>

An adhesion layer (a thickness of 3 μm to 4 μm) was formed on a surface of a substrate (a thickness of 2 mm) formed of a polycarbonate/an ABS resin alloy by using the same method as that in Example 1.

Next, Silver Ink Composition (II-3) ("RA RS 056", manufactured by Toyochem Co., Ltd., a silver concentration of 66 mass %, and a synthetic resin content of 1 mass % to 10 mass %) which was formed by being blended with silver particles was applied onto the adhesion layer by using a screen printing method, and then was subjected to a heating (baking) treatment at 80° C. for 2 hours in an oven, and thus a silver layer (a thickness of 1 μm) was formed on the surface of the adhesion layer as a conductive layer, and a laminate was obtained.

Next, a circuit board was manufactured and evaluated by using the same method as that in Example 1 using this laminate. The results thereof are shown in Table 8.

Comparative Example 9

<Evaluation of Silver Plate>

In a silver plate having a thickness of 0.1 mm, Kurtosis of a roughness curve of a surface of a silver layer (the silver plate) and a change rate thereof were calculated by using the same method as that in Example 1. The results thereof are shown in Table 8.

TABLE 7

| | Silver Ink Composition | | | |
|---|---|---|---|---|
| | Blended Component | | | |
| | Type | Silver Carboxylate | Nitrogen-Containing Compound (Molar Ratio) | Alcohol (Molar Ratio) |
| Example 13 | I-3 | Silver 2-Methylacetoacetate | 2-Ethylhexyl-amine (2.25) | 3,5-Dimethyl-1-Hexyne-3-Ol (0.10) |

TABLE 8

<Conductive Adhesive Agent: QMI516IE>

| | Laminate | Chip | | Evaluation Result | | | |
|---|---|---|---|---|---|---|---|
| | Silver Layer | Plating of | | Joining Force | | Kurtosis | |
| | Forming Material | Terminal Portion | Time | Measured Value (N) | Change Rate (%) | Calculated Value | Change Rate (%) |
| Example 13 | Silver Ink Composition (I-3) | Gold | 0 | 10.1 | 0 | 3.5 | 0 |
| | | | 240 | 16.2 | 59 | 41.7 | 1091 |
| | | | 480 | 15.8 | 55 | 413.7 | 11720 |
| Example 14 | Silver Ink Composition (II-1) | Gold | 0 | 10.4 | 0 | 3.2 | 0 |
| | | | 240 | 14.3 | 38 | 35.7 | 1016 |
| | | | 480 | 15.2 | 46 | 197.7 | 6078 |
| Comparative Example 7 | Silver Ink Composition (II-2) | Gold | 0 | — | — | 6.1 | 0 |
| | | | 240 | — | — | 9.1 | 49 |
| | | | 480 | — | — | 10 | 64 |
| Comparative Example 8 | Silver Ink Composition (II-3) | Gold | 0 | — | — | 4.2 | 0 |
| | | | 240 | — | — | 5 | 19 |
| | | | 480 | — | — | 4.9 | 17 |
| Comparative Example 9 | (Silver Plate) | — | 0 | — | — | 30.7 | 0 |
| | | | 240 | — | — | 32.9 | 7 |
| | | | 480 | — | — | 30 | −2 |

As it is obvious from the results described above, in the laminate of Examples 13 and 14, the Kurtosis of the roughness curve of the silver layer surface satisfied both Conditions (i) and (ii), and thus even when the laminate was retained for a long period of time under high temperature and high humidity conditions, a high joining (adhering) force between the silver layer and the electronic component was maintained. In these examples, the peeling portion of the chip was observed in the circuit board after measuring the shearing force (the joining force), and in any example, it was confirmed that the chip peeled off due to the cohesion failure of the joining (adhering) layer which was formed by curing the conductive adhesive agent regardless of before starting the retention or after the retention. That is, in the circuit board, the interface fracture did not occur in either the interface between the joining layer and the silver layer or the interface between the joining layer and the electronic component.

In contrast, in the laminate of Comparative Examples 7 and 8 and the silver plate of Comparative Example 9, the Kurtosis of the roughness curve of the silver layer surface did not satisfy both Conditions (i) and (ii).

The calculated value and the change rate of the Kurtosis of the roughness curve shown in the results described above were obtained from the exposed surface of the silver layer surface on which the joining layer was not formed, and the calculated value and the change rate of the Kurtosis of the surface (the interface with respect to the joining layer) on which the joining layer was formed were confirmed, and as a result thereof, the calculated value and the change rate of the Kurtosis of the surface on which the joining layer was formed were the same values as those of the exposed surface, and indicated the same tendency with respect to the Kurtosis of the roughness curve regardless of the exposure of the silver layer surface.

Example 15 and 16

<Manufacturing of Laminate and Circuit Board, and Evaluation of Circuit Board>

A laminate and a circuit board were manufactured by using the same method as that in Examples 13 and 14 except that "CA-110" manufactured by Ajinomoto General Foods, Inc. was used instead of "QMI516IE" manufactured by Henkel Japan Ltd. as a conductive adhesive agent, and the circuit board was evaluated. The results thereof are shown in Table 9.

TABLE 9

<Conductive Adhesive Agent: CA-110>

| | Laminate | Chip | | Evaluation Result | | | |
|---|---|---|---|---|---|---|---|
| | Silver Layer | Plating of | | Joining Force | | Kurtosis | |
| | Forming Material | Terminal Portion | Time | Measured Value (N) | Change Rate (%) | Calculated Value | Change Rate (%) |
| Example 15 | Silver Ink Composition (I-3) | Gold | 0 | 7.5 | 0 | 3.5 | 0 |
| | | | 240 | 8.2 | 9 | 41.7 | 1091 |
| | | | 480 | 7.9 | 5 | 413.7 | 11720 |
| Example 16 | Silver Ink Composition (II-1) | Gold | 0 | 7.1 | 0 | 3.2 | 0 |
| | | | 240 | 7.8 | 10 | 35.7 | 1016 |
| | | | 480 | 7.3 | 3 | 197.7 | 6078 |

The laminate of Examples 15 and 16 is identical to the laminate of Examples 13 and 14, and as described above, the Kurtosis of the roughness curve of the silver layer surface satisfies both Conditions (i) and (ii). Then, as it is obvious from the results described above, even when the circuit board of Examples 15 and 16 was retained for a long period of time under high temperature and high humidity conditions, a high joining (adhering) force between the silver layer and the electronic component was maintained. In these examples, the peeling portion of the chip was observed in the circuit board after measuring the shearing force (the joining force), and in any example, it was confirmed that the chip peeled off due to the cohesion failure of the joining (adhering) layer which was formed by curing the conductive adhesive agent regardless of before starting the retention or after the retention. That is, in the circuit board, the interface fracture did not occur in either the interface between the joining layer and the silver layer or the interface between the joining layer and the electronic component.

<Evaluation of Laminate>

The laminate of Examples 1 and 2, the laminate of Comparative Examples 7 and 8, and the silver plate of Comparative Example 9 were further evaluated by using the following method.

That is, the laminate of Examples 1 and 2 and the laminate of Comparative Examples 7 and 8 were cooled by using liquid nitrogen, and were cut, and thus a sectional surface was exposed as shown in FIG. 1. In addition, the silver plate of Comparative Example 9 was cut using a microtome, and thus a sectional surface was exposed.

Next, the laminate (a cut laminate) or the silver plate (a cut silver plate) including this sectional surface was placed and retained under the conditions as those of Example 1 (under conditions of a temperature of 85° C. and a relative humidity of 85%), the Kurtosis (Rku) of the roughness curve of the sectional surface (that is, the exposed surface under conditions of a temperature of 85° C. and a relative humidity of 85%) of the silver layer was calculated before starting the retention and after 240 hours and 480 hours had elapsed from starting the retention of the silver layer, and the change rate of the Kurtosis after the retention of the silver layer for a predetermined period of time with respect to the Kurtosis before starting the retention was calculated. The results thereof are shown in Table 10. Furthermore, the Kurtosis of the roughness curve was calculated by the following method. That is, the shape of the sectional surface of the silver layer was measured by using a shape measurement laser microscope ("VK-X100", manufactured by Keyence Corporation), a high-pass filter (a cutoff value $\lambda_C$: 0.08 mm) was applied to the obtained sectional surface curve, and thus the roughness curve was obtained. Then, the Kurtosis (Rku) of the roughness curve was calculated from the profile of the obtained roughness curve.

TABLE 10

| Laminate | | Evaluation Result | |
|---|---|---|---|
| Silver Layer | | Kurtosis | |
| Forming Material | Time | Calculated Value | Change Rate (%) |
| Example 1 | Silver Ink | 0 | 2.3 | 0 |
| | Composition | 240 | 4.4 | 91 |
| | (I-1) | 480 | 8.9 | 287 |
| Example 2 | Silver Ink | 0 | 2.1 | 0 |
| | Composition | 240 | 5.7 | 171 |
| | (I-2) | 480 | 6.7 | 219 |
| Comparative Example 7 | Silver Ink | 0 | 2.8 | 0 |
| | Composition | 240 | 3.8 | 36 |
| | (II-2) | 480 | 4 | 43 |
| Comparative Example 8 | Silver Ink | 0 | 2.9 | 0 |
| | Composition | 240 | 3.5 | 21 |
| | (II-3) | 480 | 3.6 | 24 |

TABLE 10-continued

| Laminate | | Evaluation Result | |
|---|---|---|---|
| Silver Layer | | Kurtosis | |
| Forming Material | Time | Calculated Value | Change Rate (%) |
| Comparative Example 9 | (Silver Plate) | 0 | 2.7 | 0 |
| | | 240 | 3 | 11 |
| | | 480 | 3.2 | 19 |

As described above, even when the laminate of Examples 1 and 2 is retained for a long period of time under high temperature and high humidity conditions, a high joining (adhering) force between the silver layer and the electronic component is maintained. Then, as it is obvious from the results described above, in the laminate of Examples 1 and 2, the Kurtosis of the roughness curve of the sectional surface of the silver layer satisfied both Conditions (i) and (ii), and the Kurtosis of the roughness curve and the change rate thereof indicated the same tendency in the surface on which the electronic component was mounted through the conductive joint portion and the sectional surface. That is, the change rate of the Kurtosis of the roughness curve of the sectional surface of the silver layer satisfied at least one of Conditions (i) and (ii), and thus it was confirmed that the silver layer was able to maintain a high joining force with respect to the electronic component under high temperature and high humidity conditions.

In contrast, in both of the laminate of Comparative Examples 7 and 8 and the silver plate of Comparative Example 9, the Kurtosis of the roughness curve of the silver layer surface did not satisfy both Conditions (i) and (ii).

INDUSTRIAL APPLICABILITY

The present invention is able to be used in a circuit board including silver wiring and an electronic component on a substrate.

REFERENCE SIGNS LIST 1,2,3 LAMINATE
11 SUBSTRATE
11a SURFACE OF SUBSTRATE
12 SILVER LAYER
12a SURFACE OF SILVER LAYER
12b REAR SURFACE OF SILVER LAYER
13 ADHESION LAYER
13a SURFACE OF ADHESION LAYER
14 CHIP (ELECTRONIC COMPONENT)
14a,14b TERMINAL PORTION OF CHIP
14c MAIN BODY PORTION OF CHIP
15 JOINING LAYER (ADHESIVE LAYER)
30 CIRCUIT BOARD

What is claimed is:
1. A method for manufacturing a circuit board, the method comprising:
attaching a composition for an adhesion layer onto a substrate to form an adhesion layer, wherein the substrate is a polycarbonate (PC)/ABS resin alloy,
attaching a silver ink composition onto the adhesion layer, and heat treating the silver ink composition at 60° C. to 80° C. to form a silver layer, wherein the silver ink composition comprises silver carboxylate, a nitrogen-containing compound, and an additive, and the additive is a reducing agent or an acetylene alcohol, and wherein the silver layer includes a surface in which Kurtosis of a roughness curve satisfies at least one of Conditions (i) and (ii) described below, (i) a change rate of Kurtosis is greater than or equal to 50% under conditions of a temperature of 85° C. and a relative humidity of 85% after 240 hours have elapsed, and (ii) a change rate of Kurtosis is greater than or equal to 200% under conditions of a temperature of 85° C. and a relative humidity of 85% after 480 hours have elapsed, the Kurtosis of the roughness curve is a value obtained by Expression (I) described below, $$Rku = \frac{1}{Rq^4}\left[\frac{1}{\ell}\int_0^\ell Z^4(x)\,dx\right] \quad (I)$$

wherein, in Expression (I), Rq represents a root-mean-square height, l represents a reference length which becomes non-dimensional by the fourth power of the root-mean-square height Rq, and Z(x) represents the roughness curve, mounting an electronic component on the surface of the silver layer, wherein the Kurtosis of a roughness curve for the surface of the silver layer satisfies at least one of Conditions (i) and (ii) described above, through a conductive joint portion, and when a test of placing the silver layer for 480 hours under conditions of a temperature of 85° C. and a relative humidity of 85% is performed, a change rate of the joining force between the silver layer and the electronic component is greater than or equal to −50%.

2. The method for manufacturing a circuit board according to claim 1, wherein a thickness of the substrate is 10 μm to 10000 μm, and a thickness of the silver layer is 0.01 μm to 5 μm.

3. The method for manufacturing a circuit board according to claim 1, wherein a ratio of the weight of metal silver with respect to the total weight of the silver layer is 99 to 99.9 mass%.

4. The method for manufacturing a circuit board according to claim 1, wherein the Kurtosis of the roughness curve is obtained by measuring a surface shape of the silver layer of the laminate from an upper portion with respect to the surface by using a shape measurement laser microscope.

5. The method for manufacturing a circuit board according to claim 1, wherein the Kurtosis of the roughness curve is obtained by measuring a shape of a sectional surface which is exposed by cutting or machining the silver layer of the laminate from an upper portion with respect to the sectional surface by using a shape measurement laser microscope.

6. The method for manufacturing a circuit board according to claim 1, in the silver ink composition, a blended amount of the nitrogen-containing compound is 0.2 mol to 15 mol per 1 mol of a blended amount of the silver carboxylate.

7. The method for manufacturing a circuit board according to claim 1, wherein the adhesion layer is formed by polymerizing an urethane acrylate resin having a polycarbonate skeleton and has 0.5 μm to 4 μm.

8. A method for manufacturing a circuit board, the method comprising:

attaching a composition for an adhesion layer onto a substrate to form an adhesion layer, wherein the substrate is a polycarbonate (PC)/ABS resin alloy, attaching a silver ink composition onto the adhesion layer, heat treating the silver ink composition at 60° C. to 80° C. to form a silver layer, and mounting an electronic component on the surface of the silver layer, wherein the Kurtosis of a roughness curve for the surface of the silver layer satisfies at least one of Conditions (i) and (ii) described below, through a conductive joint portion;

(i) a change rate of Kurtosis is greater than or equal to 50% under conditions of a temperature of 85° C. and a relative humidity of 85% after 240 hours have elapsed, and (ii) a change rate of Kurtosis is greater than or equal to 200% under conditions of a temperature of 85° C. and a relative humidity of 85% after 480 hours have elapsed, the Kurtosis of the roughness curve is a value obtained by Expression (I) described below, $$Rku = \frac{1}{Rq^4}\left[\frac{1}{\ell}\int_0^\ell Z^4(x)\,dx\right] \quad (1)$$

wherein, in Expression (I), Rq represents a root-mean-square height, l represents a reference length which becomes non-dimensional by the fourth power of the root-mean-square height Rq, and Z(x) represents the roughness curve, wherein the silver ink composition comprises silver carboxylate, a nitrogen-containing compound, and an additive, and the additive is a reducing agent or an acetylene alcohol, wherein the adhesion layer is formed by polymerizing a urethane acrylate resin having a polycarbonate skeleton, the adhesion layer having a thickness of 0.5 μm to 10 μm, and when a test of placing the silver layer for 480 hours under conditions of a temperature of 85° C. and a relative humidity of 85% is performed, a change rate of the joining force between the silver layer and the electronic component is greater than or equal to −50%.

9. The method for manufacturing a circuit board according to claim 8, wherein the conductive joint portion is a joining layer formed by curing a conductive adhesive agent, or a solder layer.

10. A method for manufacturing a circuit board, the method comprising:

attaching a composition for an adhesion layer onto a substrate to form an adhesion layer, wherein the substrate is a polycarbonate (PC)/ABS resin alloy, attaching a silver ink composition onto the adhesion layer, heat treating the silver ink composition at 60° C. to 80° C. to form a silver layer, and mounting an electronic component on the surface of the silver layer, wherein the Kurtosis of a roughness curve for the surface of the silver layer satisfies at least one of Conditions (i) and (ii) described below, through a conductive joint portion;

(i) a change rate of Kurtosis is greater than or equal to 50% under conditions of a temperature of 85° C. and a relative humidity of 85% after 240 hours have elapsed, and (ii) a change rate of Kurtosis is greater than or equal to 200% under conditions of a temperature of 85° C. and a relative humidity of 85% after 480 hours have elapsed, the Kurtosis of the roughness curve is a value obtained by Expression (I) described below, $$Rku = \frac{1}{Rq^4}\left[\frac{1}{\ell}\int_0^\ell Z^4(x)dx\right] \quad (1)$$

wherein, in Expression (I), Rq represents a root-mean-square height, l represents a reference length which becomes non-dimensional by the fourth power of the root-mean-square height Rq, and Z(x) represents the roughness curve, and wherein the silver ink composition comprises silver carboxylate, a nitrogen-containing compound, and an additive, and the additive is a reducing agent or an acetylene alcohol, wherein the adhesion layer is formed by using a silane coupling agent, the adhesion layer having a thickness of 0.5 pm to 10 μm, when a test of placing the silver layer for 480 hours under conditions of a temperature of 85° C. and a relative humidity of 85% is performed, a change rate of the joining force between the silver layer and the electronic component is greater than or equal to −50%.

11. The method for manufacturing a circuit board according to claim 10, wherein the silane coupling agent is a compound denoted by General Formula (3) described below,

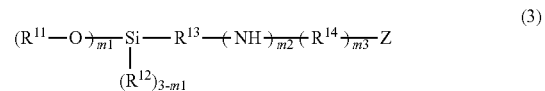

wherein, in General Formula (3), $R^{11}$ represents an alkyl group having 1 to 5 carbon atoms, an alkoxyalkyl group or an alkylcarbonyl group; $R^{12}$ represents an alkyl group having 1 to 5 carbon atoms or an aryl group having 6 to 12 carbon atoms; $R^{13}$ represents an alkylene group having 1 to 10 carbon atoms; $R^{14}$ represents an alkylene group having 1 to 5 carbon atoms, one or more methylene groups among the alkylene groups may be substituted with a carbonyl group; Z represents an amino group, a mercapto group, or an aryl group having 6 to 12 carbon atoms; m1 represents 2 or 3, a plurality of $R^{11}$ may be identical to each other or different from each other; m2 and m3 each independently represent 0 or 1, and when Z is an amino group, at least one of m2 and m3 represents 1.

* * * * *

UNITED STATES PATENT AND TRADEMARK OFFICE
CERTIFICATE OF CORRECTION

PATENT NO. : 10,849,231 B2
APPLICATION NO. : 14/778162
DATED : November 24, 2020
INVENTOR(S) : Akihito Mori It is certified that error appears in the above-identified patent and that said Letters Patent is hereby corrected as shown below:

In the Claims

Claim 10 at Column 51, Line 32:    now reads "0.5 pm"
should read -- 0.5 µm --

Signed and Sealed this
Twenty-seventh Day of July, 2021

Drew Hirshfeld
*Performing the Functions and Duties of the
Under Secretary of Commerce for Intellectual Property and
Director of the United States Patent and Trademark Office*